(12) United States Patent
Lee

(10) Patent No.: US 7,396,775 B2
(45) Date of Patent: Jul. 8, 2008

(54) METHOD FOR MANUFACTURING SEMICONDUCTOR DEVICE

(75) Inventor: Sang Don Lee, Gyeonggi-do (KR)

(73) Assignee: Hynix Semiconductor Inc. Inc., Icheon-si (KR)

( * ) Notice: Subject to any disclaimer, the term of this patent is extended or adjusted under 35 U.S.C. 154(b) by 0 days.

(21) Appl. No.: 11/139,443

(22) Filed: May 31, 2005

(65) Prior Publication Data

US 2006/0216881 A1 Sep. 28, 2006

(30) Foreign Application Priority Data

Mar. 25, 2005 (KR) .................. 10-2005-0024930

(51) Int. Cl.
*H01L 21/31* (2006.01)
*H01L 21/469* (2006.01)

(52) U.S. Cl. .............. 438/761; 438/283; 438/289; 438/787; 257/E21.705; 257/E21.598; 257/E21.532

(58) Field of Classification Search ............ 438/199, 438/216, 146, 279, 299, 197, 283, 289, 761, 438/763, 778, 787, FOR. 211, FOR. 214, 438/FOR. 219, FOR. 395; 257/E21.532, 257/E21.598, E21.705
See application file for complete search history.

(56) References Cited

U.S. PATENT DOCUMENTS

| 4,679,311 | A | * | 7/1987 | Lakhani et al. | 438/471 |
| 5,953,599 | A | | 9/1999 | El-Diwany | 438/199 |
| 6,436,777 | B1 | * | 8/2002 | Ota | 438/305 |
| 6,670,248 | B1 | * | 12/2003 | Ang et al. | 438/287 |
| 6,750,525 | B2 | | 6/2004 | Yim | 257/500 |
| 6,933,195 | B2 | | 8/2005 | Lee | 438/258 |
| 2002/0033501 | A1 | * | 3/2002 | Sakagami | 257/315 |
| 2003/0145299 | A1 | * | 7/2003 | Fried et al. | 716/11 |
| 2005/0186742 | A1 | * | 8/2005 | Oh et al. | 438/283 |

FOREIGN PATENT DOCUMENTS

KR 1020000044855 A 7/2000

OTHER PUBLICATIONS

C.H. Lee et al., "Novel Body Tied FinFET Cell Array Transistor DRAM with Negative Word Line Operation for sub 60nm Technology and beyond", 2004 Symposium on VLSI Technology Digest of Technical Papers, pp. 130-131.

* cited by examiner

*Primary Examiner*—Fernando L. Toledo
*Assistant Examiner*—Quovaunda Jefferson
(74) *Attorney, Agent, or Firm*—Townsend and Townsend and Crew LLP

(57) ABSTRACT

The present invention discloses improved method for manufacturing semiconductor device wherein the gate oxide films in the cell region, $V_{PP}$ peripheral circuit region and $V_{DD}$ peripheral circuit region are formed to have different thicknesses from one another so that the threshold voltage of the cell transistor may be increased to a desired value as well as increasing the operation speed of the transistor and suppress the short channel effect.

25 Claims, 30 Drawing Sheets

(i)

(ii)

(iii)

(iv)

(i)

(ii)

(iii)

(iv)

( i )

( ii )

( iii )

( iv )

(i)

(ii)

(i)

(ii)

(i) 
(ii)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

(i)

(ii)

(iii)

(iv)

METHOD FOR MANUFACTURING SEMICONDUCTOR DEVICE

BACKGROUND OF THE INVENTION

1. Field of the Invention

The present invention relates to method for manufacturing semiconductor device, and in particular to an improved method for manufacturing semiconductor device wherein the gate oxide films in the cell region, $V_{PP}$ peripheral circuit region and $V_{DD}$ peripheral circuit region are formed to have different thicknesses from one another so that the threshold voltage of the cell transistor may be increased to a desired value as well as increasing the operation speed of the transistor and suppress the short channel effect.

2. Description of the Background Art

An integrated circuit includes a cell region where cell transistors for storing data are formed, a $V_{PP}$ peripheral circuit region where transistors used for generating a $V_{PP}$ voltage and as paths for transferring the $V_{PP}$ voltage are formed, and a $V_{DD}$ peripheral circuit region where transistors to which a $V_{DD}$ or a $V_{CORE}$ voltage which is lower than the $V_{PP}$ voltage are formed. A conventional transistor formed in above regions and method for manufacturing the same will now be described.

FIGS. 1A and 1B are cross-sectional views illustrating a conventional transistor of semiconductor device in a cell region, wherein FIGS. 1A and 1B respectively illustrate cross-sections perpendicular and parallel to a word line in a cell region.

Referring to FIGS. 1A and 1B, a recessed device isolation film 65 defining an active region is disposed on a semiconductor substrate 10. A sidewall oxide film 40 and a liner nitride film 50 are disposed at an interface of the semiconductor substrate 10 and the recessed device isolation film 65. A stacked structure 80+90 of a first gate oxide film pattern 80 and a second gate oxide film pattern 90 is disposed at an interface of a gate structure 130 which is a word line comprising a stacked structure of the lower gate electrode 100, the upper gate electrode 110 and the hard mask pattern 120 and the semiconductor substrate 10.

FIGS. 2A and 2B are cross-sectional views illustrating a conventional transistor of semiconductor device in $V_{PP}$ peripheral circuit region, wherein FIGS. 2A and 2B respectively illustrates cross-sections perpendicular and parallel to gate structures of a transistor in a $V_{PP}$ peripheral circuit region.

Referring to FIGS. 2A and 2B, a device isolation film 60 defining an active region is disposed on a semiconductor substrate 10. A sidewall oxide film 40 and a liner nitride film 50 are disposed at an interface of the semiconductor substrate 10 and the device isolation film 60. A stacked structure 80+90 of a first gate oxide film pattern 80 and a second gate oxide film pattern 90 is disposed at an interface of a gate structure comprising a stacked structure of the lower gate electrode 100, the upper gate electrode 110 and the hard mask pattern 120 and the semiconductor substrate 10.

FIGS. 3A and 3B are cross-sectional views illustrating a conventional transistor of semiconductor device in $V_{DD}$ peripheral circuit region, wherein FIGS. 3A and 3B respectively illustrates cross-sections perpendicular and parallel to gate structures of a transistor in a $V_{DD}$ peripheral circuit region.

Referring to FIGS. 3A and 3B, the structure of the transistor in the $V_{DD}$ peripheral circuit region is similar to that of the transistor in the $V_{PP}$ peripheral circuit region shown in FIGS. 2A and 2B. However, only a second gate oxide film pattern 90 is disposed at an interface of a gate structure 130 comprising a stacked structure of the lower gate electrode 100, the upper gate electrode 110 and the hard mask pattern 120 and the semiconductor substrate 10. That is, the thickness of the gate oxide film differs from those of the gate oxide film in the cell region and the $V_{PP}$ peripheral circuit region. The thickness of the gate oxide film of the transistor in the cell region shown in FIGS. 1A and 1B is substantially the same as that of the transistor in the $V_{PP}$ peripheral circuit region shown in FIGS. 2A and 2B, and larger than that of the transistor in the $V_{DD}$ peripheral circuit region shown in FIGS. 3A and 3B.

FIGS. 4A through 4F are cross-sectional views illustrating a conventional method for manufacturing transistor of semiconductor device, wherein (i) and (ii) of FIG. 4 respectively illustrate cross-sections perpendicular to and parallel to a word line in a cell region, and (iii) and (iv) of FIG. 4 respectively illustrate cross-sections perpendicular to gate structures of a transistor in a $V_{PP}$ peripheral circuit region and in a $V_{DD}$ peripheral circuit region.

Referring to FIG. 4A, a pad oxide film 20 and a pad nitride film 30 are sequentially formed on a semiconductor substrate 10 including a cell region where cell transistors are formed, a $V_{PP}$ peripheral circuit region where transistors used for generation and transfer of $V_{PP}$ voltage are formed, and a $V_{DD}$ peripheral circuit region where $V_{DD}$ transistors are formed. Thereafter, a predetermined region of the pad nitride film 30, the pad oxide film 20 and the semiconductor substrate 10 are etched to form a device isolation trench (not shown). The semiconductor substrate 10 at a top corner of the device isolation trench is etched so that the top corner is rounded. A sidewall oxide film 40 and a liner nitride film 50 are then formed on the entire surface of the semiconductor substrate 10 including the device isolation trench. Thereafter, an oxide film (not shown) for the device isolation film 60 is formed on the entire surface of the semiconductor substrate 10 and then planarized until the pad nitride film 30 is exposed to form the device isolation film 60 defining an active region 10a.

Now referring to FIG. 4B, a predetermined thickness of the device isolation film 60 is etched so that the height of the device isolation film 60 is reduced. Thereafter, the pad nitride film 30 is removed by etching. A predetermined amount of the sidewall oxide film 40 and the liner nitride film 50 is also etched during the etching process of the pad nitride film 30. Thereafter, the pad oxide film 20 is removed by etching to expose the semiconductor substrate 10. A buffer oxide layer 70 is then formed on the exposed semiconductor substrate 10. Next, an impurity is selectively implanted into the semiconductor substrate 10 to form a deep n-well (not shown), cell p-well (not shown), p-well (not shown) and an n-well (not shown). A channel implant process for adjusting threshold voltage and punch-through voltage is then performed.

Referring to FIG. 4C, a photoresist film pattern (not shown) exposing the cell region is formed. A predetermined thickness of the device isolation film 60 in the cell region is etched using the photoresist film pattern as an etching mask. Thereafter, the semiconductor substrate 10 is subjected to an angled implant process for adjusting an impurity concentration of the channel region using the photoresist film pattern as an implant mask to inject an impurity containing boron into the semiconductor substrate 10 in the cell region. The photoresist film pattern is then removed.

Referring to FIG. 4D, the exposed portion of liner nitride film 50 is removed. Thereafter, the buffer oxide layer 70 and the sidewall oxide film 40 are removed by etching to expose a portion of the semiconductor substrate 10. The exposed portion of the semiconductor substrate 10 is then oxidized to form a first gate oxide film 80. Next a photoresist film pattern (not shown) exposing the $V_{DD}$ peripheral circuit region is then formed. An impurity for controlling threshold voltage is implanted into the semiconductor substrate 10 in the $V_{DD}$ peripheral circuit region using the photoresist film pattern as an implant mask. Thereafter, an exposed portion of the first gate oxide film 80 in the $V_{DD}$ peripheral circuit region is removed by etching using the photoresist film pattern as an etching mask. The photoresist film pattern is then removed.

Referring to FIG. 4E, the first gate oxide film pattern 80 is subjected to a cleaning process. Thereafter, a second gate oxide film 90 is formed on surfaces of the first gate oxide film 80 and the semiconductor substrate 10 in the $V_{DD}$ peripheral circuit region. Therefore, the thickness of the gate oxide film in the cell region and the $V_{PP}$ peripheral circuit region are substantially the same as that of a stacked structure 80+90 of the first gate oxide film 80 and the second gate oxide film 90.

Referring to FIG. 4F, a conductive layer (not shown) for lower gate electrode is formed on an entire surface of the semiconductor substrate 10 and then planarized. A conductive layer (not shown) for upper gate electrode and a hard mask layer (not shown) are sequentially stacked on the conductive layer for lower gate electrode. The hard mask layer, the conductive layer for upper gate electrode and the conductive layer for lower gate electrode are etched via a photolithography and etching process using a gate mask (not shown) to form a gate structure 130 comprising a stacked structure of the lower gate electrode 100, the upper gate electrode 110 and the hard mask pattern 120. Thereafter, a source/drain region (not shown) is formed on the semiconductor substrate 10 at both sides of the gate structure 130.

As described above, in accordance with the conventional semiconductor device and method for manufacturing the same, $V_{PP}$ voltage is applied to the transistor in the cell region through $V_{PP}$ voltage generating circuit and path in the $V_{PP}$ peripheral circuit region and $V_{DD}$ or $V_{CORE}$ voltage which is lower than $V_{PP}$ voltage is applied to other parts of the semiconductor device. Therefore, the thickness of the gate oxide film in the cell region and the $V_{PP}$ peripheral circuit region is the same which is thicker than that of the gate oxide film in the $V_{DD}$ peripheral circuit region. However, in case of a cell transistor having a fin gate structure, because two or three sides of the active region are surrounded by the gate electrode, threshold voltage is decreased due to more than the liner nitride film 50% decrease in $Q_{D,MAX}$ which is a depletion charge induced by the voltage applied to the gate electrode when the silicon substrate is completely depleted by the gate voltage.

In order to increase the threshold voltage, methods such as increasing channel doping concentration $N_A$ to increase $Q_{D,MAX}$, using a gate electrode having a different work function to increase $\Phi_{MS}$ or adding a electron trap in the gate oxide film to increase $-Q_{OX}$ have been proposed.

However, the method of increasing channel doping concentration increases junction leakage current and deteriorates refresh characteristics of the device due to increase in electric field in pn junction region, the method of using a gate electrode having a different work function increases the number of processes and degrades the reliability of the device and the method of adding a electron trap in the gate oxide film results in degradation of the reliability of the device.

In accordance with conventional art, the threshold voltage of a fin gate transistor cannot be the same as that of the planar transistor when the thickness of the gate oxide film of the cell transistor is the same as that of the transistor in the $V_{PP}$ peripheral circuit region.

SUMMARY OF THE INVENTION

Accordingly, it is an object of the present invention to provide a method for manufacturing semiconductor device, wherein the gate oxide films in the cell region, $V_{PP}$ peripheral circuit region and $V_{DD}$ peripheral circuit region are formed to have different thicknesses from one another so that the threshold voltage of the cell transistor may be increased to a desired value as well as increasing the operation speed of the transistor and suppress the short channel effect.

In order to achieve the above-described object of the invention, there is provided a method for manufacturing semiconductor device, the method comprising the steps of:

(a) providing a semiconductor substrate including a cell region where cell transistors are formed, a $V_{PP}$ peripheral circuit region where transistors used for generation and transfer of $V_{PP}$ voltage are formed, and a $V_{DD}$ peripheral circuit region where $V_{DD}$ transistors are formed;

(b) forming a device isolation film on the semiconductor substrate to define an active region;

(c) etching the device isolation film in the cell region to at least expose a sidewall of a predetermined portion of the active region where a channel region is to be formed;

(d) forming a first gate oxide film pattern on a surface of the active region including the exposed sidewall in the cell region;

(e) forming a second gate oxide film pattern on the first gate oxide film pattern and a surface of the semiconductor substrate in the $V_{PP}$ peripheral circuit region;

(f) forming a third gate oxide film pattern on the second gate oxide film pattern and a surface of the semiconductor substrate in the $V_{DD}$ peripheral circuit region;

(g) forming a planarized conductive layer for a lower gate electrode on an entire surface of the semiconductor substrate;

(h) sequentially forming a conductive layer for an upper gate electrode and a hard mask layer on the conductive layer for the lower gate electrode;

(i) patterning the hard mask layer, the conductive layer for the upper gate electrode and the conductive layer for the lower gate electrode to form a gate structure comprising a stacked structure of the lower gate electrode, the upper gate electrode and a hard mask layer pattern; and (j) forming a source/drain region on the semiconductor substrate at both sides of the gate structure, wherein the thickness of the gate oxide films in the cell region, the $V_{PP}$ peripheral circuit region, and the $V_{DD}$ peripheral circuit region differs from one another.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A semiconductor device and method for manufacturing the same in accordance with preferred embodiments of the present invention will now be described in detail with reference to the accompanying drawings.

Figure 1A:
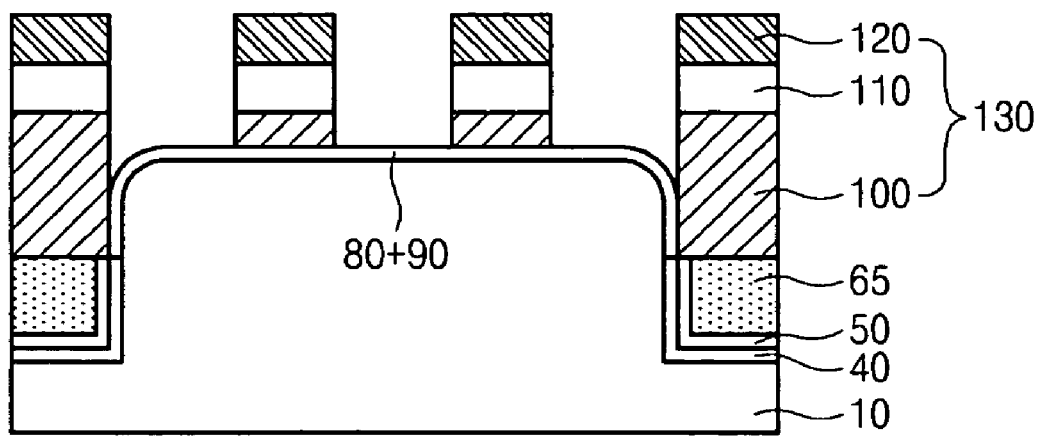
FIGS. 1A and 1B are cross-sectional views illustrating a conventional transistor of semiconductor device in a cell region.
Figure 1B:
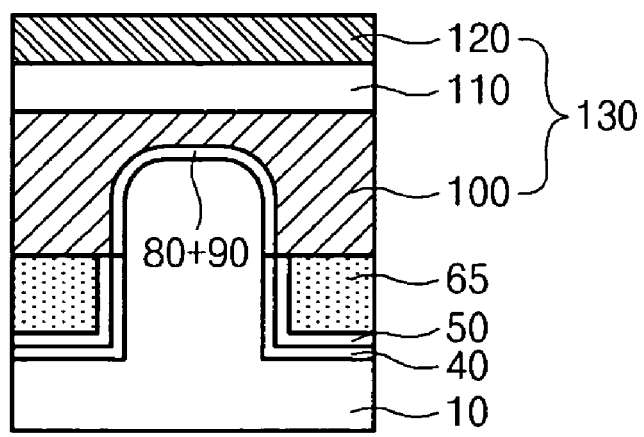
Figure 2A:
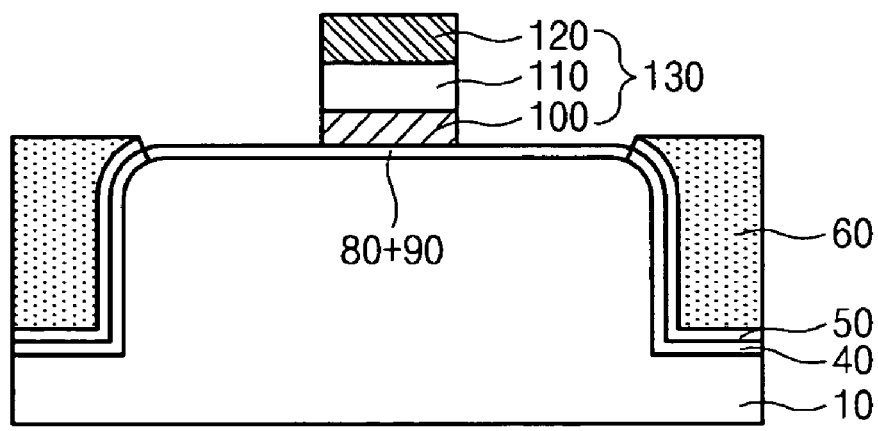
FIGS. 2A and 2B are cross-sectional views illustrating a conventional transistor of semiconductor device in $V_{PP}$ peripheral circuit region.
Figure 2B:
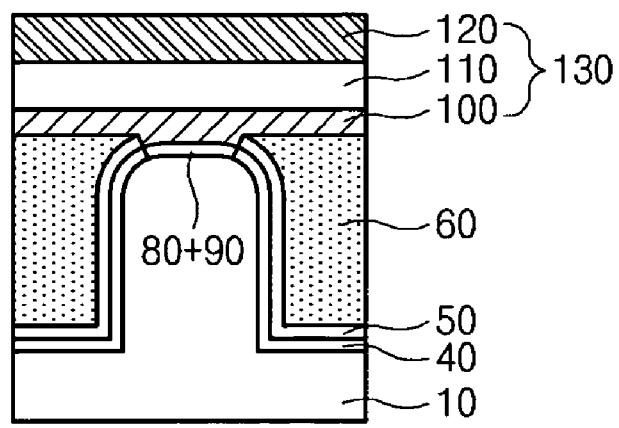
Figure 3A:
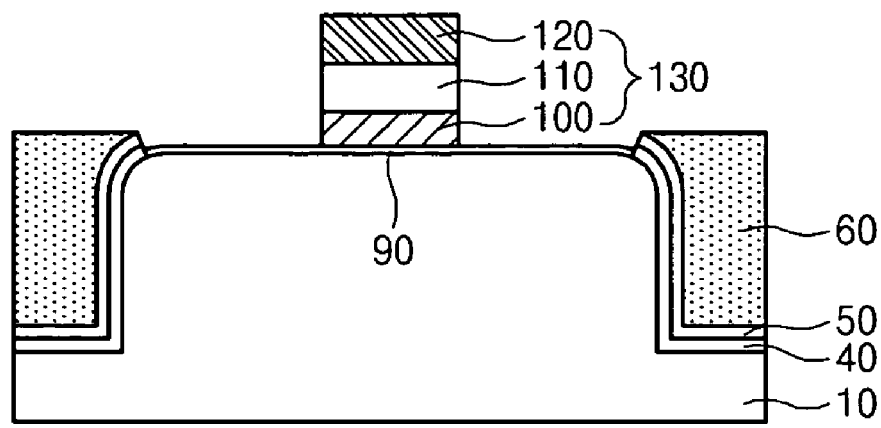
FIGS. 3A and 3B are cross-sectional views illustrating a conventional transistor of semiconductor device in $V_{DD}$ peripheral circuit region.
Figure 3B:
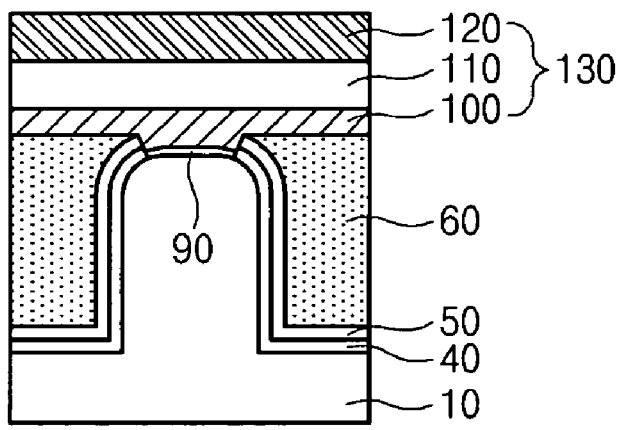
Figure 4A:
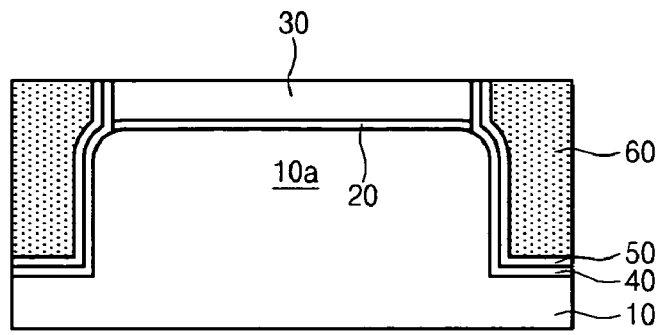
FIGS. 4A through 4F are cross-sectional views illustrating a conventional method for manufacturing transistor of semiconductor device.
Figure 4A:
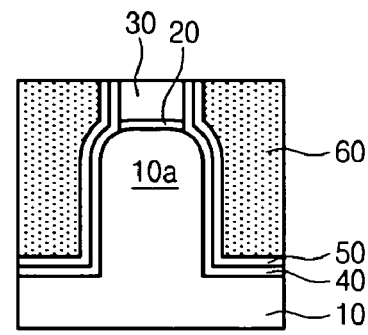
Figure 4A:
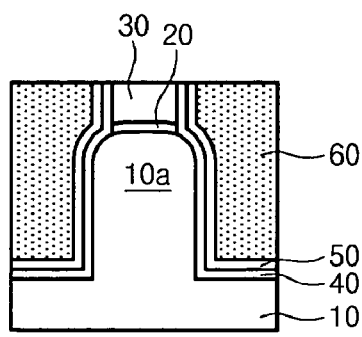
Figure 4A:
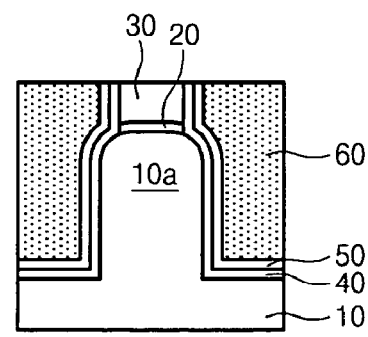
Figure 4B:
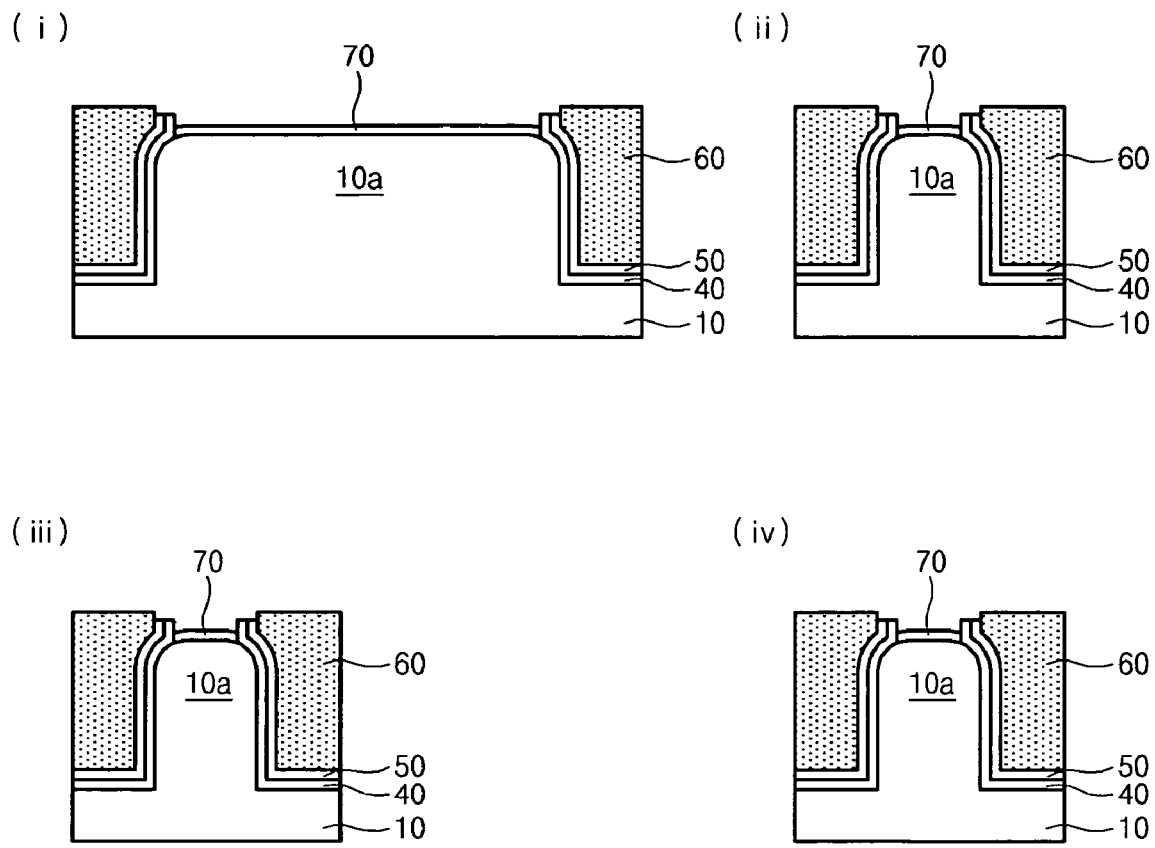
Figure 4C:
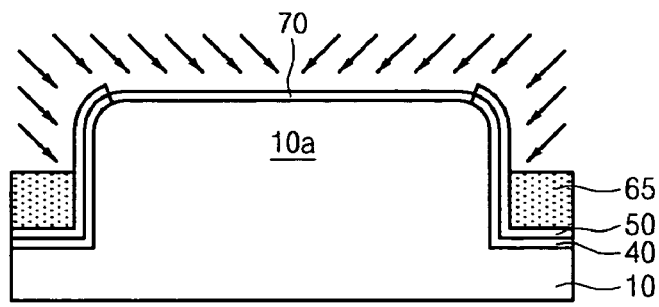
Figure 4C:
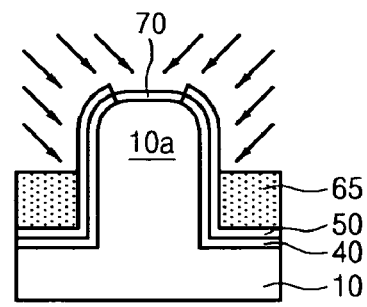
Figure 4C:
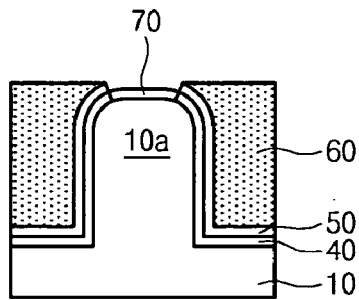
Figure 4C:
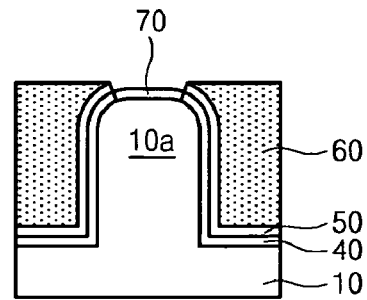
Figure 4D:
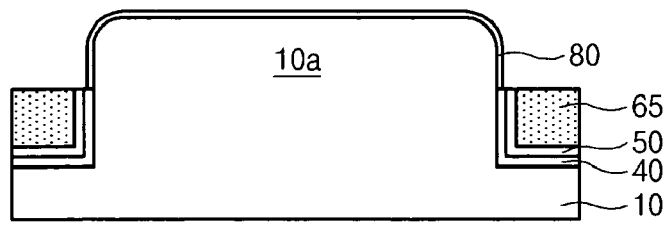
Figure 4D:
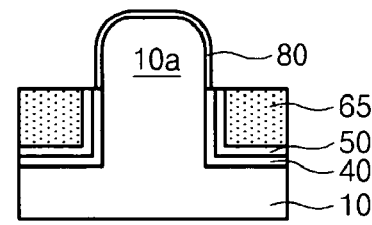
Figure 4D:
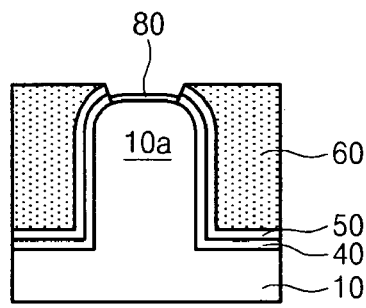
Figure 4D:
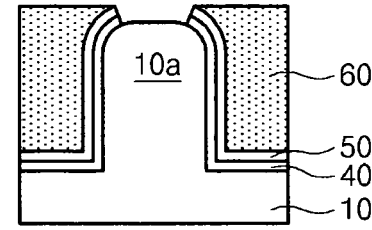
Figure 4E:
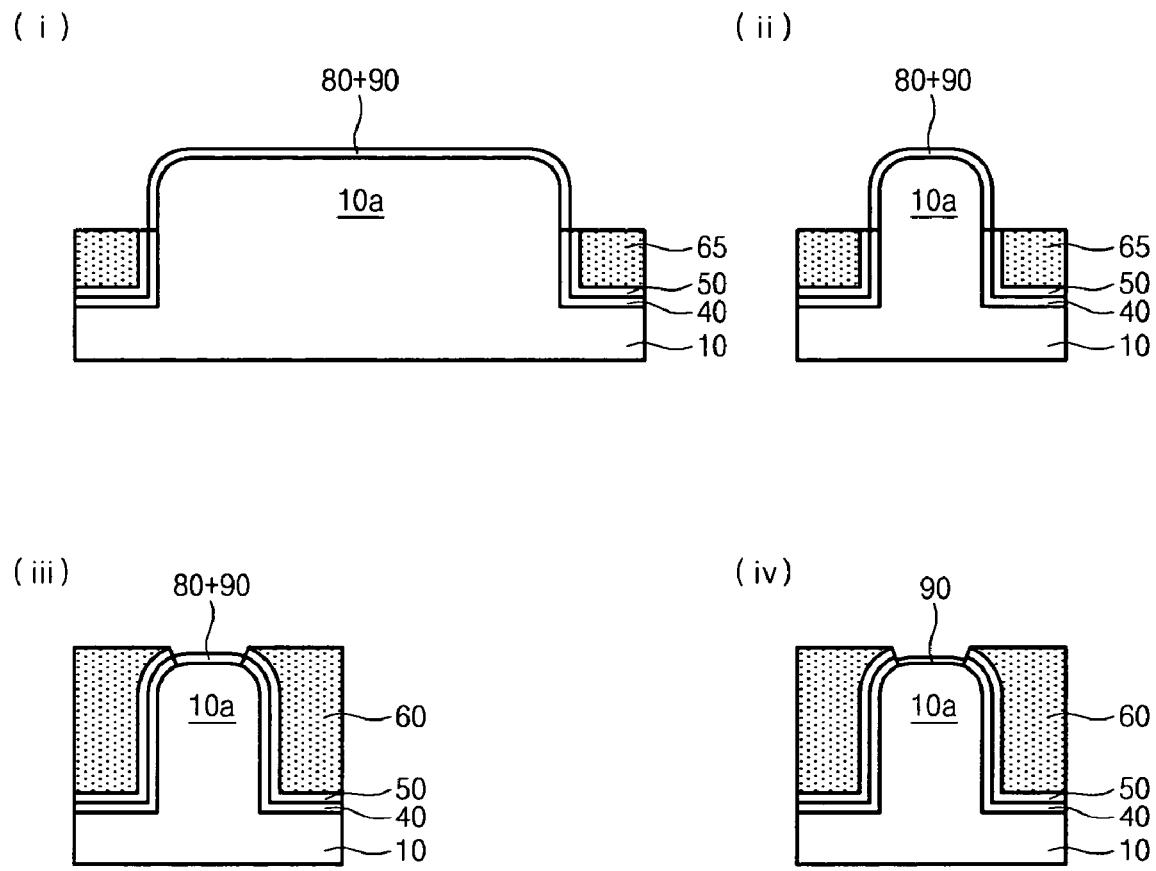
Figure 4F:
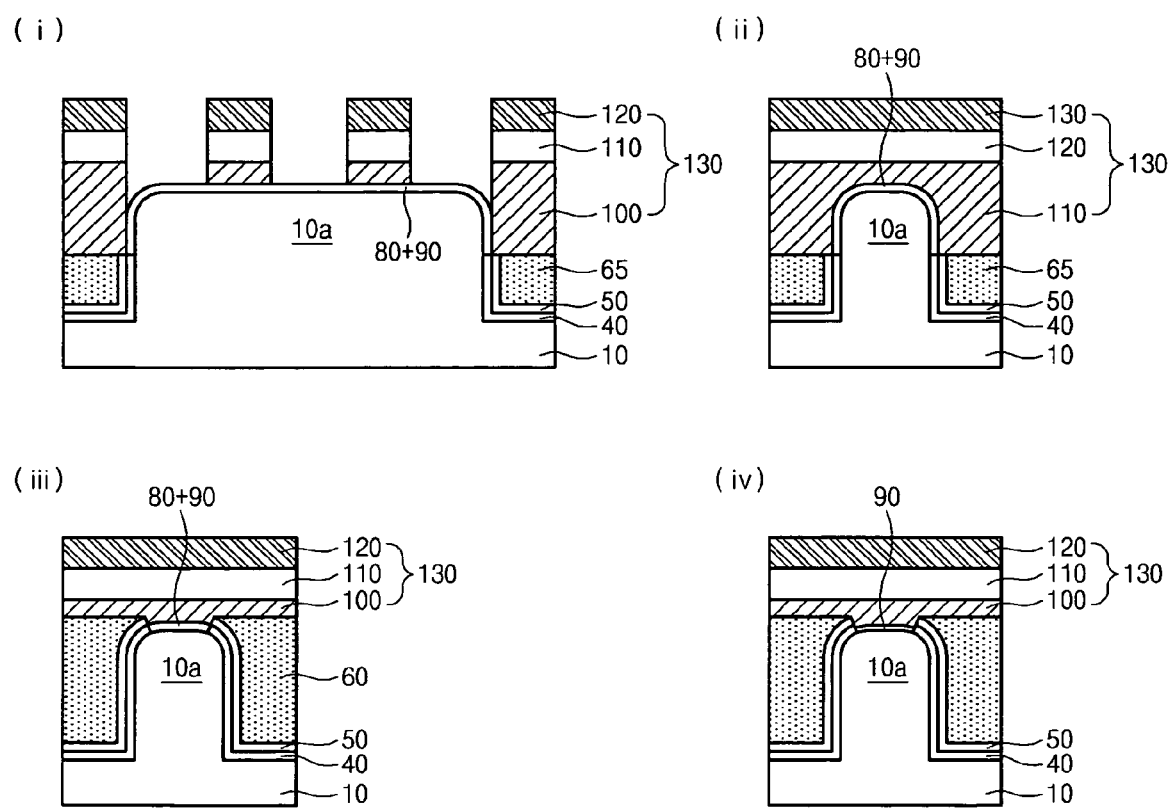
Figure 5:
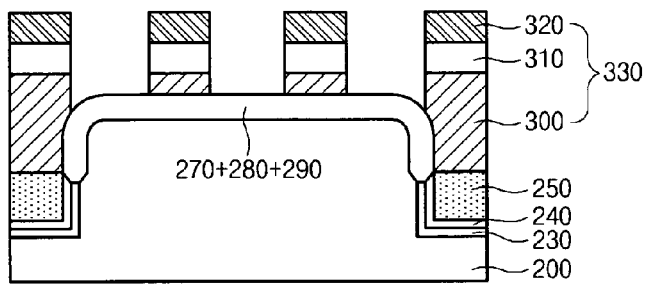
FIGS. 5 through 7 are cross-sectional views illustrating semiconductor device in accordance with a first preferred embodiment of the present invention.
Figure 5:
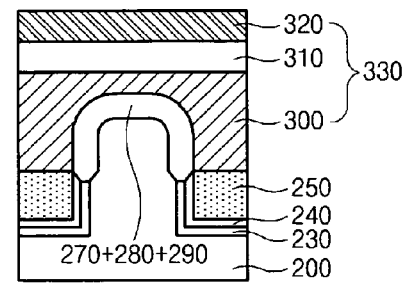
Figure 6:
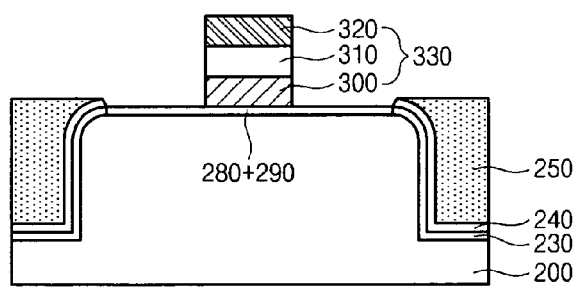
Figure 6:
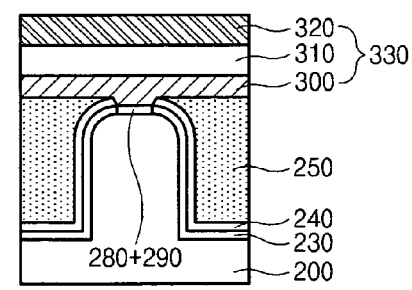
Figure 7:
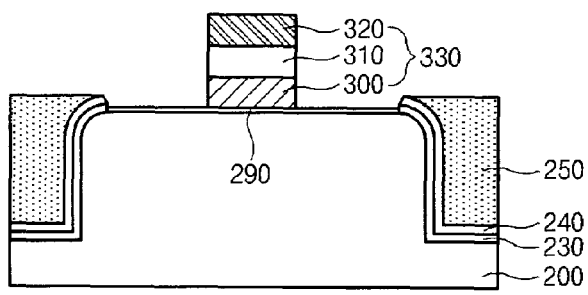
Figure 7:
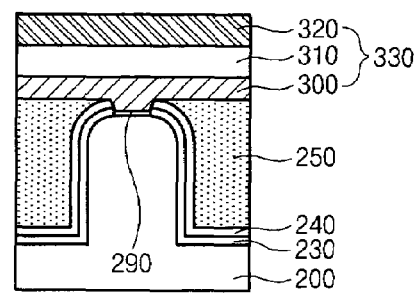

FIGS. 5 through 7 are cross-sectional views illustrating semiconductor device in accordance with a first preferred embodiment of the present invention, wherein (i) and (ii) of FIG. 5 respectively illustrate cross-sections perpendicular to a word line in a cell region and parallel to the word line, (i) and (ii) of FIG. 6 respectively illustrate cross-sections perpendicular and parallel to a gate structure of a transistor in a $V_{PP}$ peripheral circuit region, and (i) and (ii) of FIG. 7 respectively illustrate cross-sections perpendicular and parallel to a gate structure of a transistor in a $V_{DD}$ peripheral circuit region.

Referring to FIGS. 5 through 7, a device isolation film 250 is disposed on a semiconductor substrate 200. A sidewall oxide film 230 and a liner nitride film 240 are disposed at an interface of the semiconductor substrate 200 and the device isolation film 250. Gate oxide films 270+280+290, 280+290 and 290 are disposed on the semiconductor substrate 200. A gate structure 330 comprising a stacked structure of a lower gate electrode pattern 300, an upper gate electrode pattern 310 and a hard mask pattern 320 is disposed on the gate oxide films 270+280+290, 280+290 and 290. The thickness of the gate oxide film 270+280+290 in the cell region is larger than that of the gate oxide film 280+290 in the $V_{PP}$ peripheral circuit region, and the thickness of the gate oxide film 280+290 in the $V_{PP}$ peripheral circuit region is larger than that of the gate oxide film 290 in the $V_{DD}$ peripheral circuit region. That is, the thickness of the gate oxide films satisfies inequality (the gate oxide film 270+280+290)>(the gate oxide film 280+290)>(the gate oxide film 290). The thickness of the gate oxide films differs from one another in accordance with voltages applied to the gates.

FIGS. 8A through 8F are cross-sectional views illustrating method for manufacturing semiconductor device in accordance with the first preferred embodiment of the present invention, wherein (i) and (ii) of FIG. 8 respectively illustrate cross-sections perpendicular to and parallel to a word line in a cell region, and (iii) and (iv) of FIG. 8 respectively illustrate cross-sections perpendicular to gate structures of a transistor in a $V_{PP}$ peripheral circuit region and in a $V_{DD}$ peripheral circuit region.

Figure 8A:
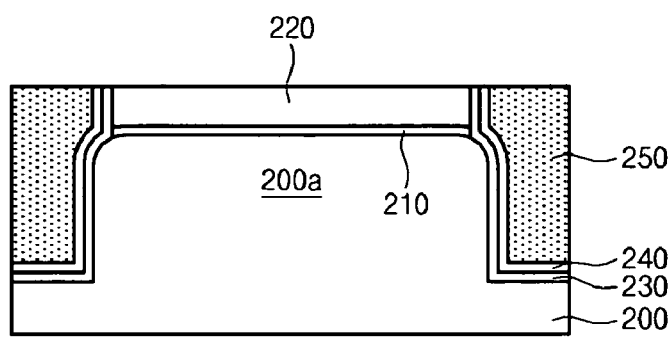
FIGS. 8A through 8F are cross-sectional views illustrating method for manufacturing semiconductor device in accordance with the first preferred embodiment of the present invention.
Figure 8A:
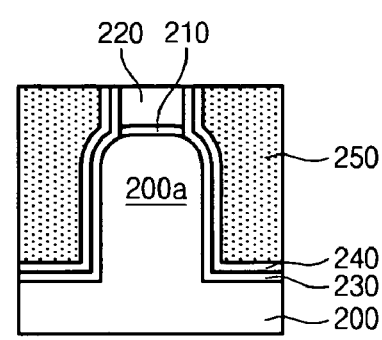
Figure 8A:
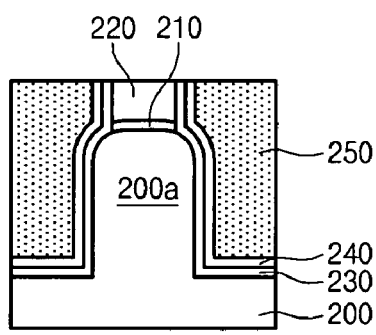
Figure 8A:
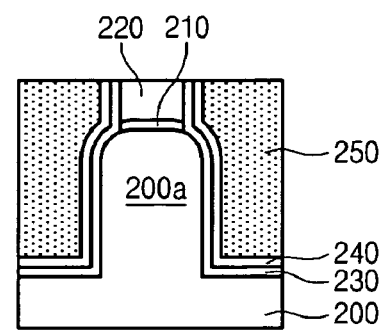

Referring to FIG. 8A, a pad oxide film 210 and a pad nitride film 220 are sequentially formed on a semiconductor substrate 200 including a cell region where cell transistors are formed, a $V_{PP}$ peripheral circuit region where transistors used for generation and transfer of $V_{PP}$ voltage are formed, and a $V_{DD}$ peripheral circuit region where $V_{DD}$ transistors are formed. Thereafter, the semiconductor substrate 200 is subjected to a STI (Shallow Trench Isolation) process to form a device isolation film 250. Specifically, a predetermined region of the pad nitride film 220, the pad oxide film 210 and the semiconductor substrate 200 are etched to form a device isolation trench (not shown). The semiconductor substrate 200 at a top corner of the device isolation trench is etched so that the top corner is rounded. A sidewall oxide film 230 and a liner nitride film 240 are then formed on the entire surface of the semiconductor substrate 200 including the device isolation trench. Thereafter, an oxide film (not shown) for the device isolation film 250 is formed on the entire surface of the semiconductor substrate 200 and then planarized until the pad nitride film 220 is exposed to form the device isolation film 250 defining an active region 200a.

Figure 8B:
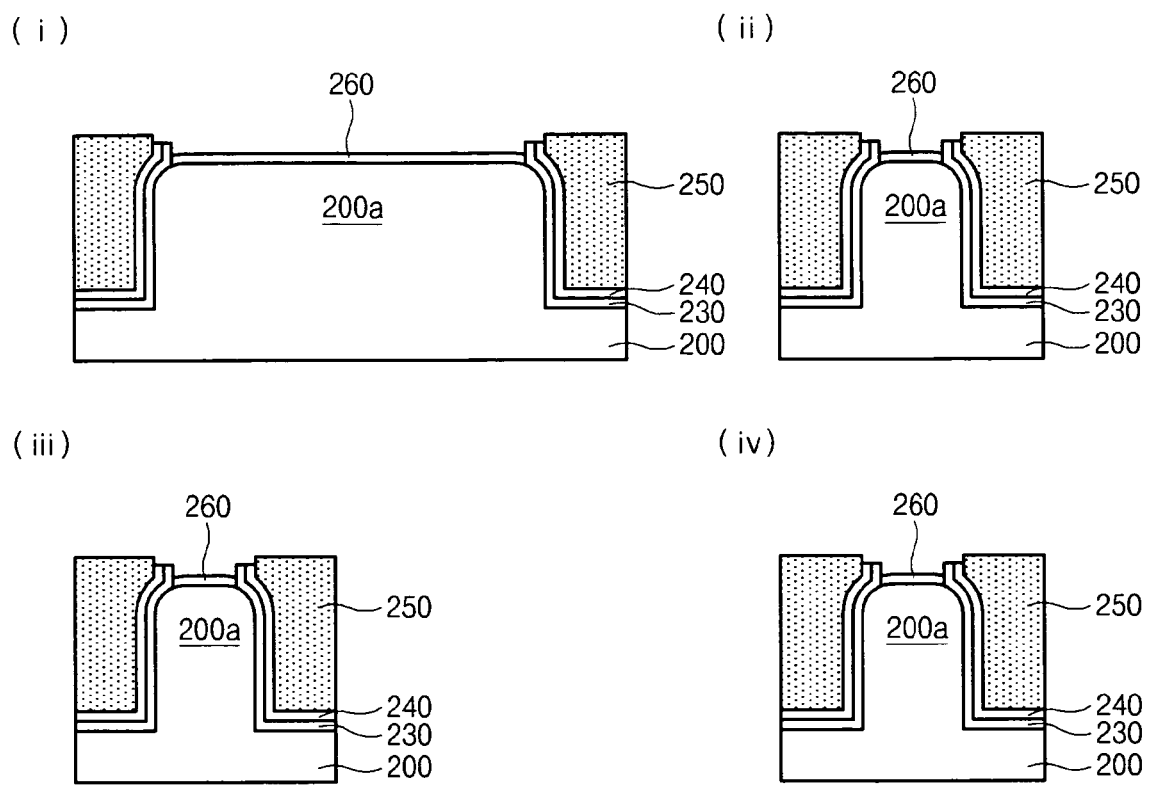

Now referring to FIG. 8B, a predetermined thickness of the device isolation film 250 is etched so that the height of the device isolation film 250 is reduced. Thereafter, the pad nitride film 220 is removed by etching. A predetermined amount of the sidewall oxide film 230 and the liner nitride film 240 is also etched during the etching process of the pad nitride film 220. Thereafter, the pad oxide film 210 is removed by etching to expose the semiconductor substrate 200. A buffer oxide layer 260 is then formed on the exposed semiconductor substrate 200. Next, an impurity is selectively implanted into the semiconductor substrate 200 to form a deep n-well (not shown), cell p-well (not shown), p-well (not shown) and an n-well (not shown). A channel implant process for adjusting threshold voltage and punch-through voltage is then performed.

Figure 8C:
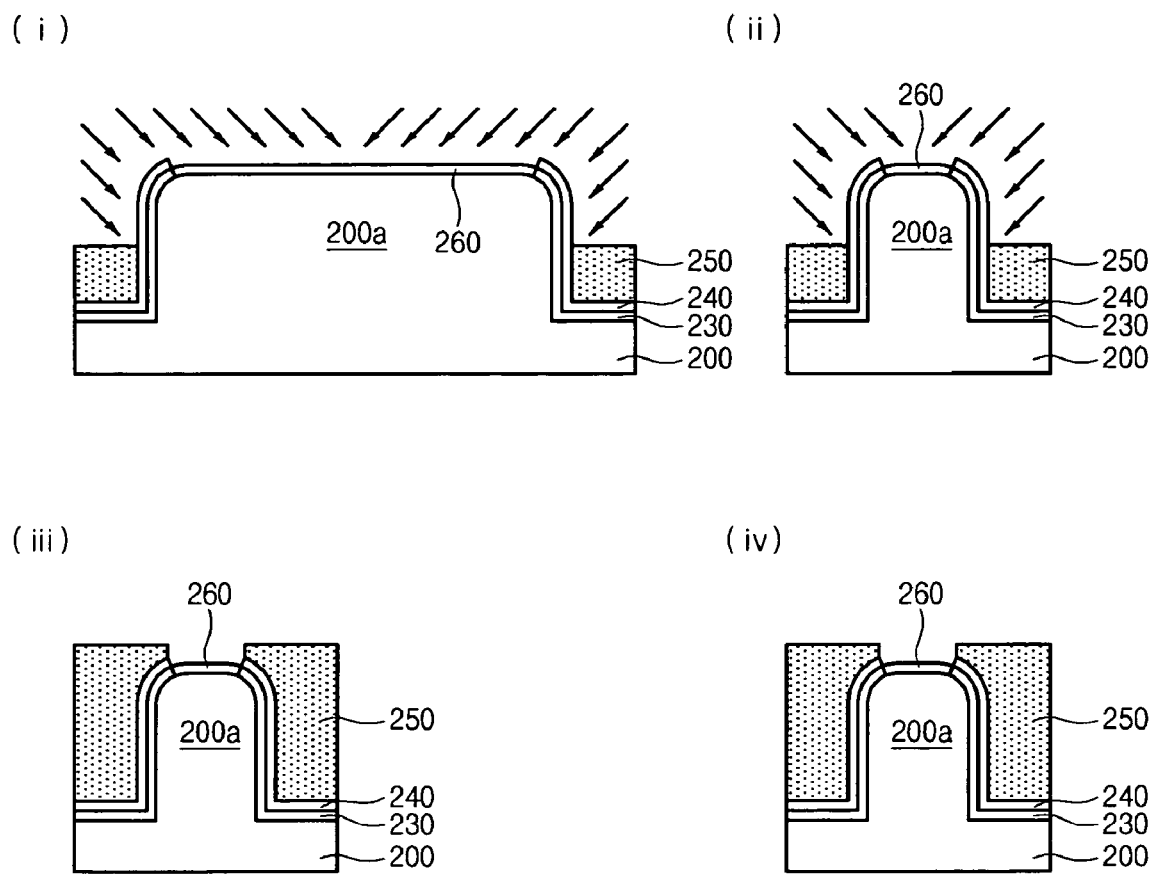

Referring to FIG. 8C, a photoresist film pattern (not shown) exposing the cell region is formed. A predetermined thickness of the device isolation film 250 in the cell region is etched using the photoresist film pattern as an etching mask. Thereafter, the semiconductor substrate 200 is subjected to an angled implant process for adjusting an impurity concentration of the channel region using the photoresist film pattern as an implant mask to inject an impurity containing boron into the semiconductor substrate 200 in the cell region. The photoresist film pattern is then removed.

Figure 8D:
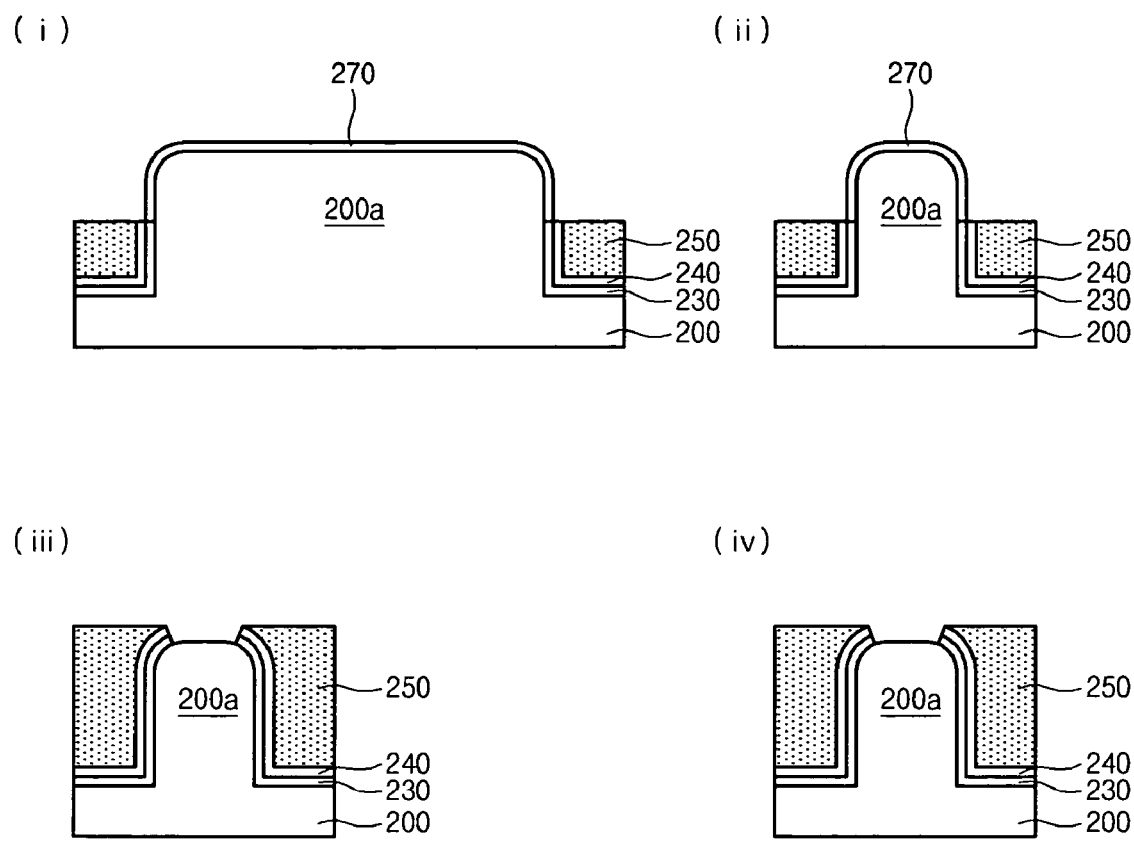

Referring to FIG. 8D, the liner nitride film 240 in the cell region is removed. Thereafter, the buffer oxide layer 260 and the sidewall oxide film 230 in the cell region are removed by etching to expose a top surface and sidewall of the semiconductor substrate 200 in the cell region. The buffer oxide layer 260 in the $V_{PP}$ peripheral circuit region and the $V_{DD}$ peripheral circuit region is also etched to expose the active region 200a of the semiconductor substrate 200. Thereafter, the exposed portions of the active region 200a are oxidized to form a first gate oxide film (not shown). A photoresist film pattern (not shown) exposing the $V_{PP}$ peripheral circuit region and the $V_{DD}$ peripheral circuit region is then formed. An exposed portion of the first gate oxide film in the $V_{PP}$ peripheral circuit region and the $V_{DD}$ peripheral circuit region is removed by wet etching using the photoresist film pattern as an etching mask to form a first gate oxide film pattern 270 in the cell region. The photoresist film pattern is then removed so that only the first gate oxide film pattern 270 remains in the cell region.

Figure 8E:
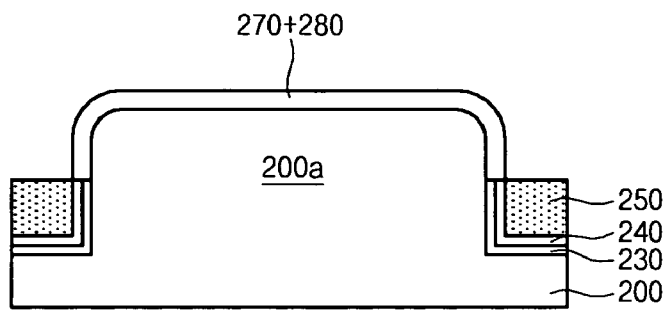
Figure 8E:
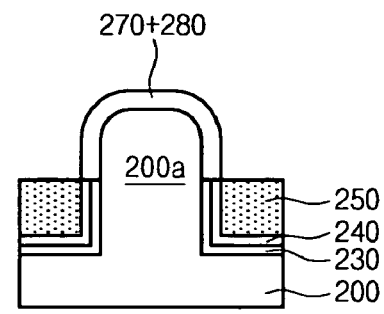
Figure 8E:
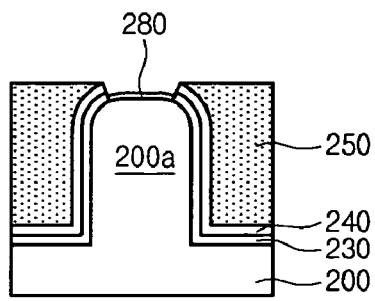
Figure 8E:
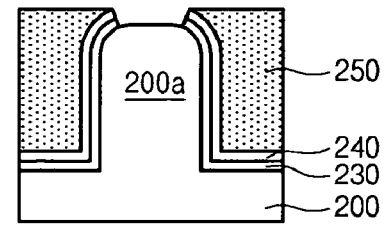

Referring to FIG. 8E, the first gate oxide film pattern 270 is subjected to a cleaning process. Thereafter, a second gate oxide film (not shown) is formed on surfaces of the first gate oxide film pattern 270 and the semiconductor substrate 200 in the $V_{PP}$ peripheral circuit region and $V_{DD}$ peripheral circuit region. A photoresist film pattern (not shown) exposing the second gate oxide film in the $V_{DD}$ peripheral circuit region is then formed. The exposed portion of the $V_{DD}$ peripheral circuit region is subjected to an impurity implant process for controlling threshold voltage of transistor. The exposed portion of the second gate oxide film in the $V_{DD}$ peripheral circuit region is removed by wet etching using the photoresist film pattern as an etching mask to form a second gate oxide film pattern 280 in the cell region and the $V_{PP}$ peripheral circuit region. The photoresist film pattern is then removed. The thickness of the gate oxide film in the cell region is substantially the same as that of a stacked structure 270+280 of the first gate oxide film pattern 270 and the second gate oxide film pattern 280.

Figure 8F:
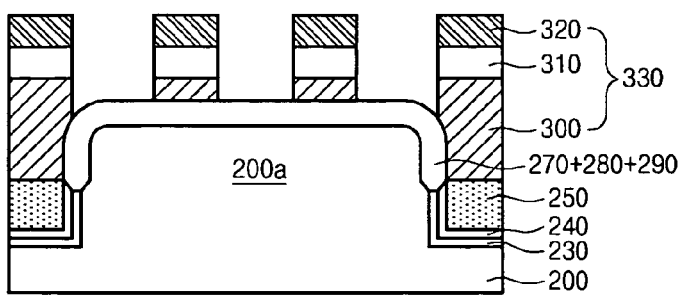
Figure 8F:
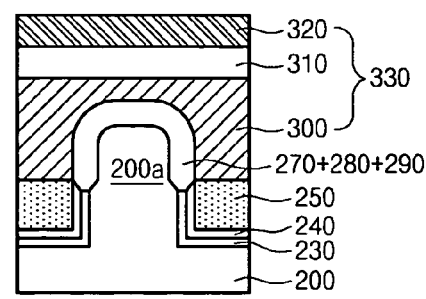
Figure 8F:
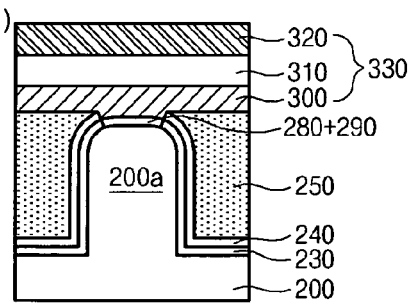
Figure 8F:
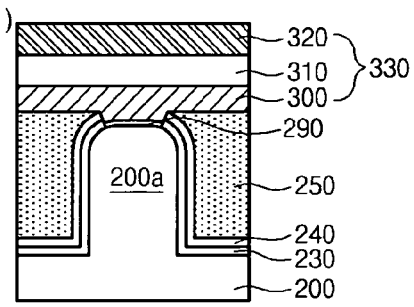

Now referring to FIG. 8F, the first gate oxide film pattern 270 and the second gate oxide film pattern 280 are subjected to a cleaning process. Thereafter, a third gate oxide film pattern 290 is formed on surfaces of the second gate oxide film pattern 280 and the semiconductor substrate 200 in the $V_{DD}$ peripheral circuit region.

Thereafter, a conductive layer (not shown) for lower gate electrode is formed on an entire surface of the semiconductor substrate 200 and then planarized. A conductive layer (not shown) for upper gate electrode and a hard mask layer (not shown) are sequentially stacked on the conductive layer for lower gate electrode. The hard mask layer, conductive layer for upper gate electrode and the conductive layer for lower gate electrode are etched via a photolithography and etching process using a gate mask (not shown) to form a gate structure 330 comprising a stacked structure of the lower gate electrode 300, the upper gate electrode 310 and the hard mask pattern 320. Thereafter, a source/drain region (not shown) is formed on the semiconductor substrate 200 at both sides of the gate structure 330.

Figure 9:
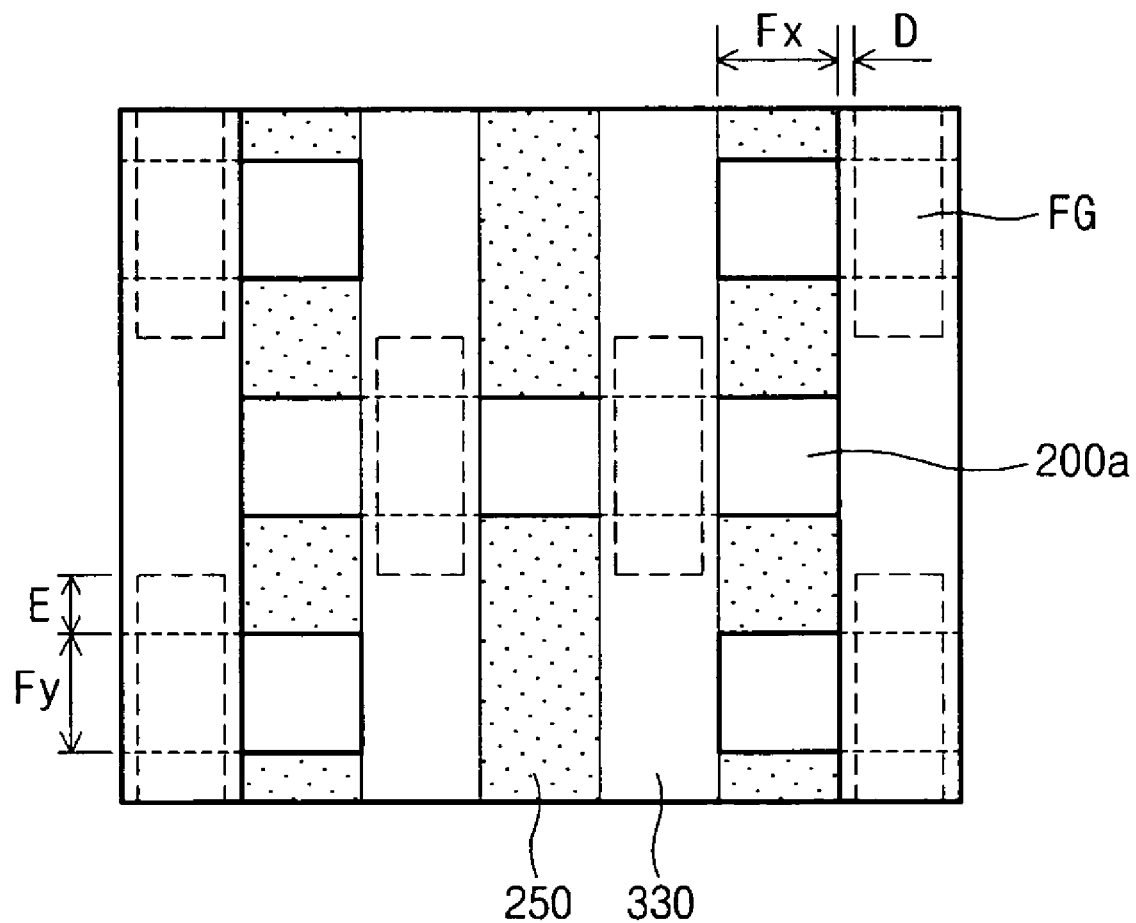
FIG. 9 is plan view illustrating a layout of semiconductor device in accordance with a second preferred embodiment of the present invention.

FIG. 9 is plan view illustrating a layout of semiconductor device in accordance with a second preferred embodiment of the present invention.

Referring to FIG. 9, a device isolation film 250, an active region 200a and a gate structure 330 which is a word line perpendicular to the active region 200a are disposed on a the semiconductor substrate. The line width of the active region 200a is $F_y$, and the distance between the gate structures 330 is $F_x$. An island type fin gate region FG has a rectangular shape and disposed under the gate structure 330. The width of the fin gate region FG is smaller than the distance $F_x$ between the gate structure 330 by 2D and the height of the fin gate region FG is larger than the line width $F_y$ of the active region 200a by 2E (where $0 \leq D < 0.5F_x$, $0 < E < 0.75F_y$). Although only rectangular shaped fin gate region FG is shown in FIG. 9, the shape of the fin gate region FG is not limited to rectangular shape. The shape of the fin gate region FG may be a polygon or an ellipse.

FIGS. 10A through 10F are cross-sectional views illustrating method for manufacturing semiconductor device in accordance with the second preferred embodiment of the present invention, wherein (i) and (ii) of FIG. 10 respectively illustrate cross-sections perpendicular and parallel to a word line in a cell region, and (iii) and (iv) of FIG. 10 respectively illustrate cross-sections perpendicular to gate structures of a transistor in a $V_{PP}$ peripheral circuit region and in a $V_{DD}$ peripheral circuit region.

Figure 10A:
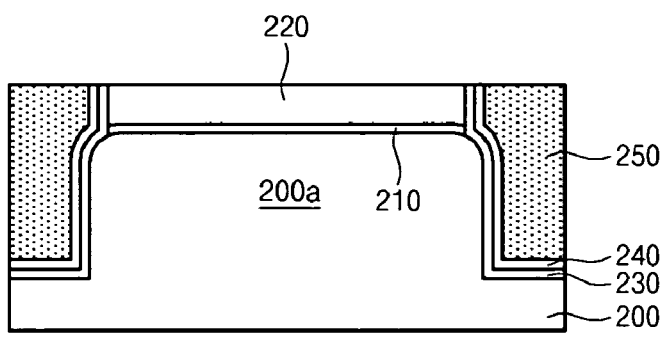
FIGS. 10A through 10F are cross-sectional views illustrating method for manufacturing semiconductor device in accordance with the second preferred embodiment of the present invention.
Figure 10A:
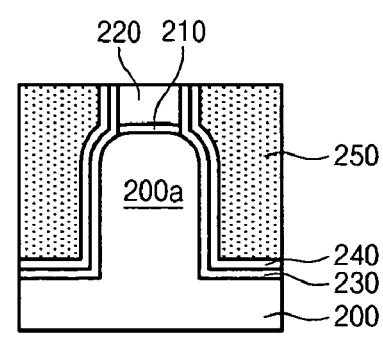
Figure 10A:
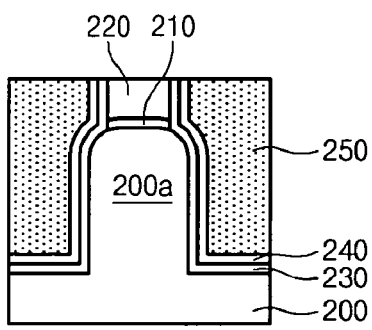
Figure 10A:
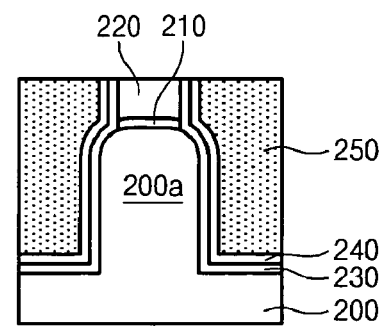

Referring to FIG. 10A, a pad oxide film 210 and a pad nitride film 220 are sequentially formed on a semiconductor substrate 200 including a cell region where cell transistors are formed, a $V_{PP}$ peripheral circuit region where transistors used for generation and transfer of $V_{PP}$ voltage are formed, and a $V_{DD}$ peripheral circuit region where $V_{DD}$ transistors are formed. Thereafter, a predetermined region of the pad nitride film 220, the pad oxide film 210 and the semiconductor substrate 200 are etched to form a device isolation trench (not shown). The semiconductor substrate 200 at a top corner of the device isolation trench is etched so that the top corner is rounded. A sidewall oxide film 230 and a liner nitride film 240 are then formed on the entire surface of the semiconductor substrate 200 including the device isolation trench. Thereafter, an oxide film (not shown) for the device isolation film 250 is formed on the entire surface of the semiconductor substrate 200 and then planarized until the pad nitride film 220 is exposed to form the device isolation film 250 defining an active region 200a.

Figure 10B:
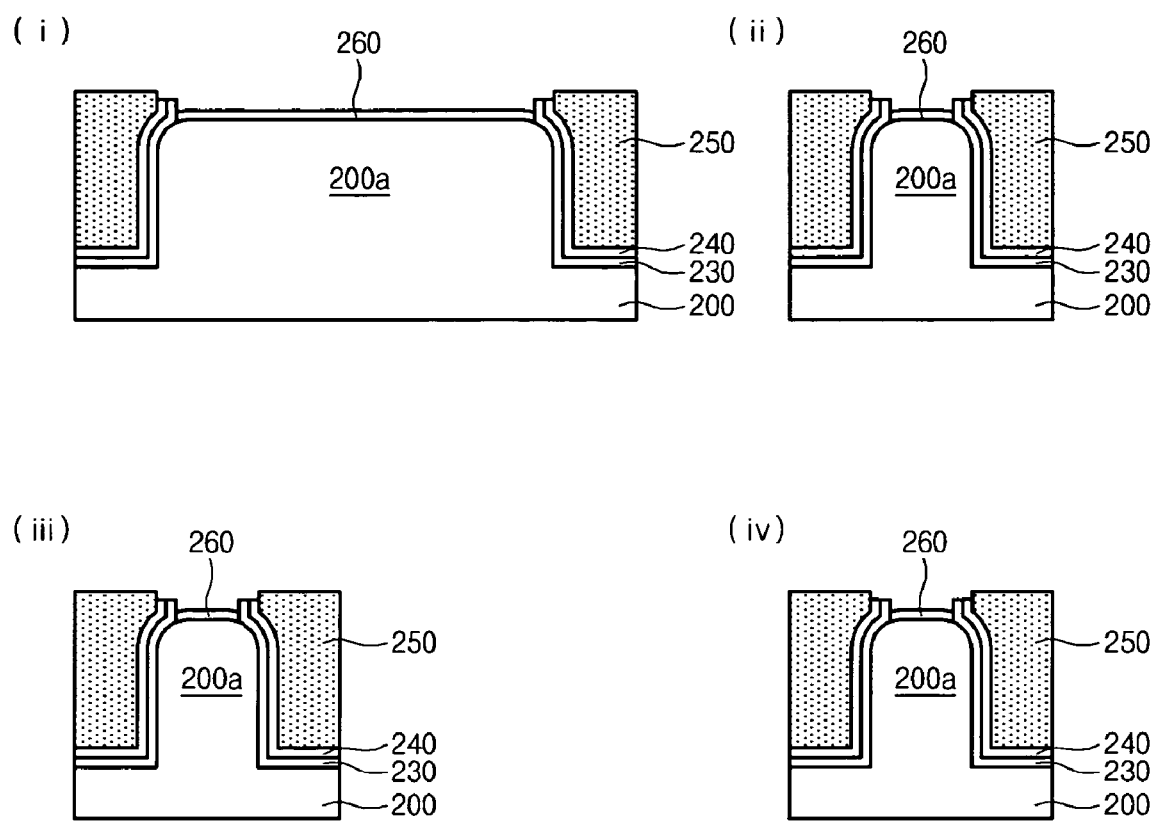

Now referring to FIG. 10B, a predetermined thickness of the device isolation film 250 is etched so that the height of the device isolation film 250 is reduced. Thereafter, the pad nitride film 220 is removed by etching. A predetermined amount of the sidewall oxide film 230 and the liner nitride film 240 is also etched during the etching process of the pad nitride film 220. Thereafter, the pad oxide film 210 is removed by etching to expose the semiconductor substrate 200. A buffer oxide layer 260 is then formed on the exposed the semiconductor substrate 200. Next, an impurity is selectively implanted into the semiconductor substrate 200 to form a deep n-well (not shown), cell p-well (not shown), p-well (not shown) and an n-well (not shown). A channel implant process for adjusting threshold voltage and punch-through voltage is then performed.

Figure 10C:
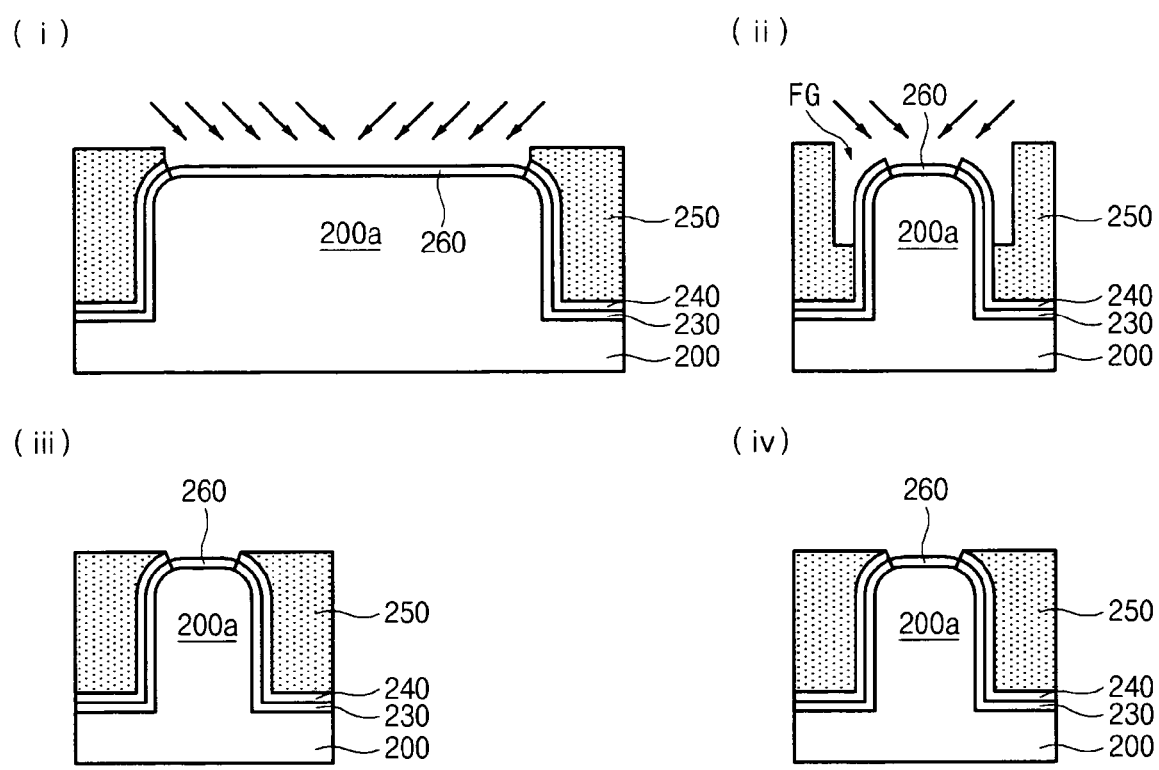

Referring to FIG. 10C, a photoresist film pattern having an island type window (not shown) exposing the fin gate region FG shown in FIG. 9 is formed. Specifically, an exposure and development process using an exposure mask comprising an island type pattern defining the fin gate region FG smaller than the width of the gate structure 330 by 2D and larger than the line width in short axis direction of the active region 200a by 2E to form the photoresist film pattern exposing a portion of the channel region, portions of the sidewall oxide film 230, the liner nitride film 240 and the device isolation film 250 adjacent to the channel region (where $0 \leq D < 0.5F_x$, $0 < E < 0.75F_y$.) A predetermined thickness of the exposed portion of the device isolation film 250 in the cell region is then etched to form the fin gate region FG. Thereafter, the semiconductor substrate 200 is subjected to an angled implant process for adjusting an impurity concentration of the channel region using the photoresist film pattern as an implant mask to inject an impurity containing boron into the semiconductor substrate 200 in the cell region. The photoresist film pattern is then removed.

Figure 10D:
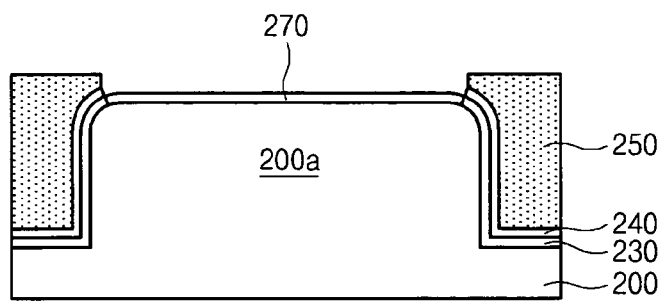
Figure 10D:
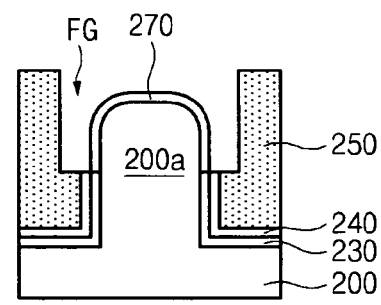
Figure 10D:
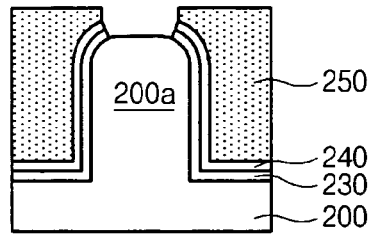
Figure 10D:
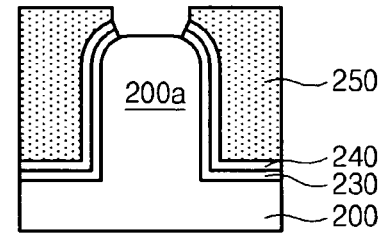

Referring to FIG. 10D, the liner nitride film 240 in the cell region is removed. Thereafter, the buffer oxide layer 260 and the sidewall oxide film 230 in the cell region are removed by etching to expose a top surface and sidewall of the semiconductor substrate 200 in the cell region. The buffer oxide layer 260 in the $V_{PP}$ peripheral circuit region and the $V_{DD}$ peripheral circuit region is also etched to expose the active region 200a of the semiconductor substrate 200. Thereafter, the exposed portions of the active region 200a are oxidized to form a first gate oxide film (not shown). A photoresist film pattern (not shown) exposing the $V_{PP}$ peripheral circuit region and the $V_{DD}$ peripheral circuit region is then formed. An exposed portion of the first gate oxide film in the $V_{PP}$ peripheral circuit region and the $V_{DD}$ peripheral circuit region is removed by wet etching using the photoresist film pattern as an etching mask to form a first gate oxide film pattern 270 in the cell region. The photoresist film pattern is then removed so that only the first gate oxide film pattern 270 remains in the cell region.

Figure 10E:
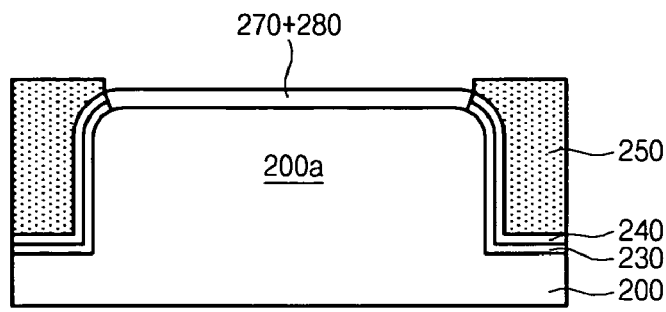
Figure 10E:
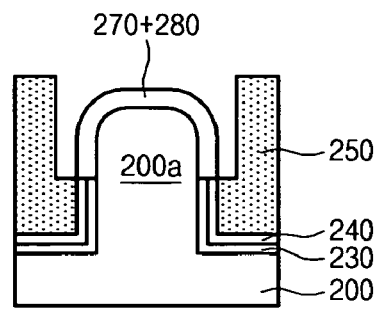
Figure 10E:
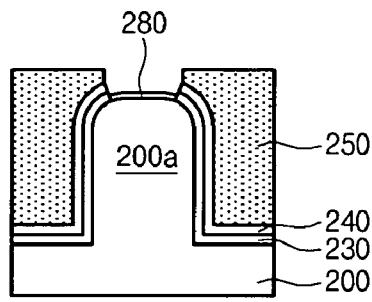
Figure 10E:
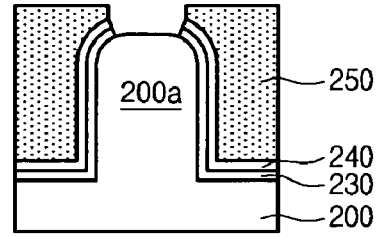

Referring to FIG. 10E, the first gate oxide film pattern 270 is subjected to a cleaning process. Thereafter, a second gate oxide film (not shown) is formed on surfaces of the first gate oxide film pattern 270 and the semiconductor substrate 200 in the $V_{PP}$ peripheral circuit region and $V_{DD}$ peripheral circuit region. A photoresist film pattern (not shown) exposing the second gate oxide film in the $V_{DD}$ peripheral circuit region is then formed. The exposed portion of the $V_{DD}$ peripheral circuit region is subjected to an impurity implant process for controlling threshold voltage of transistor. The exposed portion of the second gate oxide film in the $V_{DD}$ peripheral circuit region is removed by wet etching using the photoresist film pattern as an etching mask to form a second gate oxide film pattern 280 in the cell region and the $V_{PP}$ peripheral circuit region. The photoresist film pattern is then removed. The thickness of the gate oxide film in the cell region is substantially the same as that of a stacked structure 270+280 of the first gate oxide film pattern 270 and the second gate oxide film pattern 280.

Figure 10F:
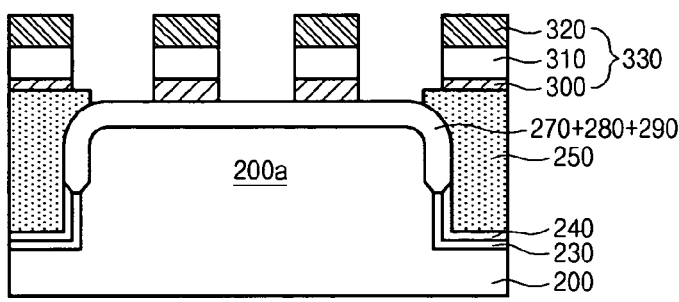
Figure 10F:
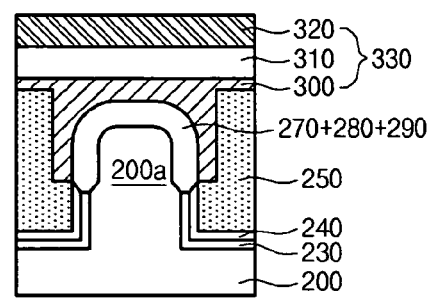
Figure 10F:
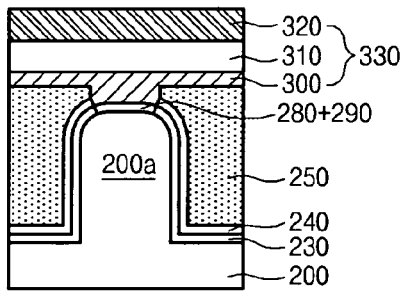
Figure 10F:
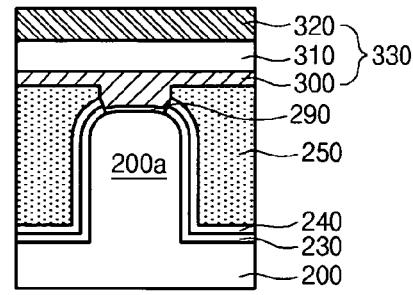

Now referring to FIG. 10F, the first gate oxide film pattern 270 and the second gate oxide film pattern 280 are subjected to a cleaning process. Thereafter, a third gate oxide film pattern 290 is formed on surfaces of the second gate oxide film pattern 280 and the semiconductor substrate 200 in the $V_{DD}$ peripheral circuit region.

Thereafter, a conductive layer (not shown) for lower gate electrode is formed on an entire surface of the semiconductor substrate 200 including the fin gate region FG and then planarized. A conductive layer (not shown) for upper gate electrode and a hard mask layer (not shown) are sequentially stacked on the conductive layer for lower gate electrode. The hard mask layer, the conductive layer for upper gate electrode and the conductive layer for lower gate electrode are etched via a photolithography and etching process using a gate mask (not shown) to form a gate structure 330 comprising a stacked structure of the lower gate electrode 300, the upper gate electrode 310 and the hard mask pattern 320. Thereafter, a source/drain region (not shown) is formed on the semiconductor substrate 200 at both sides of the gate structure 330.

FIGS. 11A through 11F are cross-sectional views illustrating method for manufacturing semiconductor device in accordance with the third preferred embodiment of the present invention, wherein (i) and (ii) of FIG. 11 respectively illustrate cross-sections perpendicular and parallel to a word line in a cell region, and (iii) and (iv) of FIG. 11 respectively illustrate cross-sections perpendicular to gate structures of a transistor in a $V_{PP}$ peripheral circuit region and in a $V_{DD}$ peripheral circuit region.

Figure 11A:
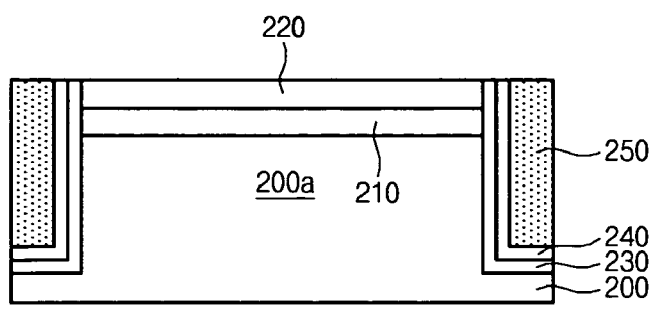
FIGS. 11A through 11F are cross-sectional views illustrating method for manufacturing semiconductor device in accordance with a third preferred embodiment of the present invention.
Figure 11A:
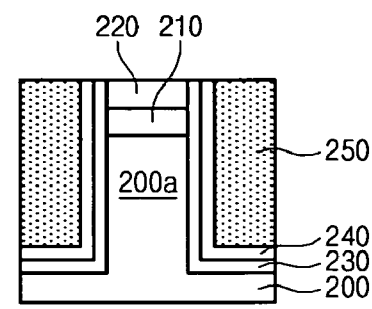
Figure 11A:
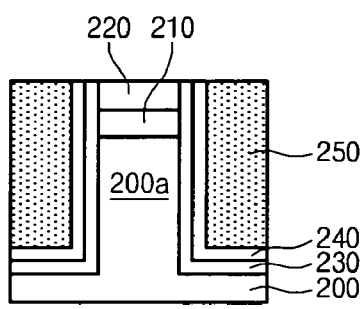
Figure 11A:
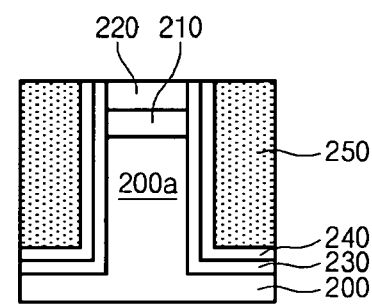

Referring to FIG. 11A, a pad oxide film 210 and a pad nitride film 220 are sequentially formed on a semiconductor substrate 200 including a cell region where cell transistors are formed, a $V_{PP}$ peripheral circuit region where transistors used for generation and transfer of $V_{PP}$ voltage are formed, and a $V_{DD}$ peripheral circuit region where $V_{DD}$ transistors are formed. Thereafter, a predetermined region of the pad nitride film 220, the pad oxide film 210 and the semiconductor substrate 200 are etched to form a device isolation trench (not shown). The semiconductor substrate 200 at a top corner of the device isolation trench is etched so that the top corner is rounded. A sidewall oxide film 230 and a liner nitride film 240 are then formed on the entire surface of the semiconductor substrate 200 including the device isolation trench. Thereafter, an oxide film (not shown) for the device isolation film 250 is formed on the entire surface of the semiconductor substrate 200 and then planarized until the pad nitride film 220 is exposed to form the device isolation film 250 defining an active region 200a.

Figure 11B:
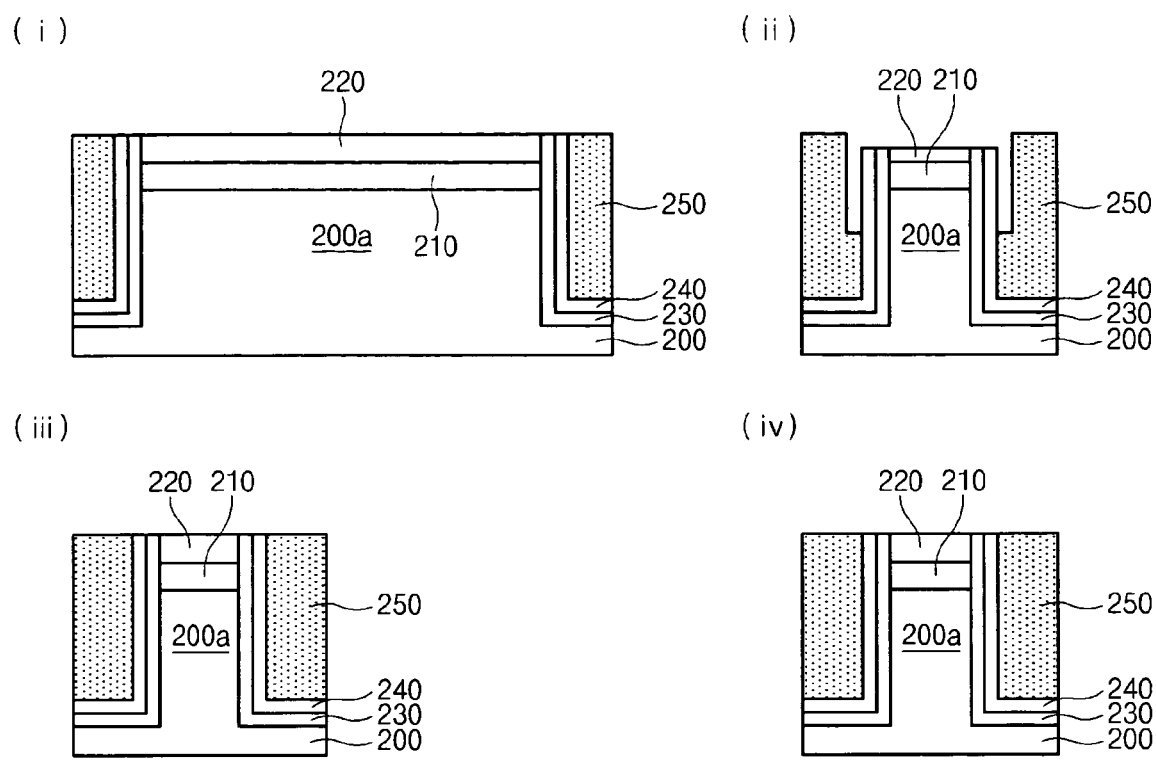

Referring to FIG. 11B, a well implant process and a channel implant process are performed to dope the cell region. Thereafter, a photoresist film pattern (not shown) defining a fin gate region shown in FIG. 9 is formed to expose portions of the sidewall oxide film 230, the liner nitride film 240 and the device isolation film 250 adjacent to the channel region of cell region. The exposed portions of the sidewall oxide film 230 and the device isolation film 250 are then etched. Since the area of the exposed portion of the sidewall oxide film 230 is smaller than that of the device isolation film 250, the etching rate of the device isolation film 250 is greater than that of the sidewall oxide film 230. Therefore, only a small portion of the sidewall oxide film 230 is etched initially while the device isolation film 250 is continuously etched to form a recess as shown in FIG. 11B. The pad nitride film 220 and the liner nitride film 240 are also etched during the etching process of the sidewall oxide film 230 and the device isolation film 250 according to etching ratio. Next, the photoresist film pattern is removed.

Figure 11C:
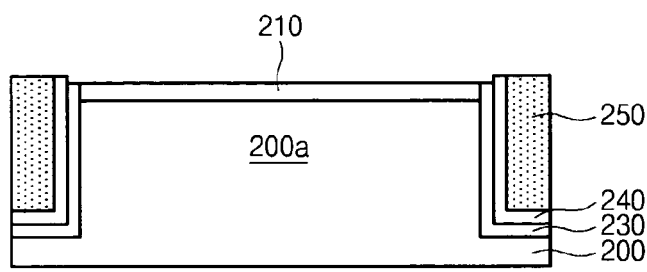
Figure 11C:
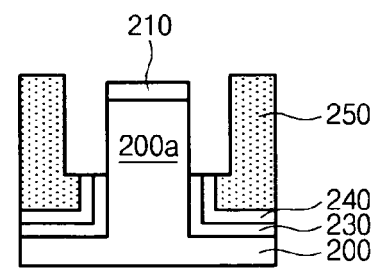
Figure 11C:
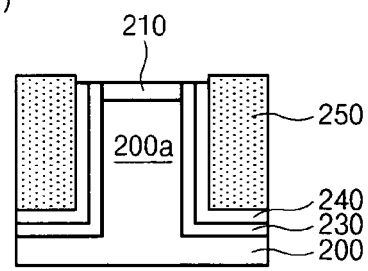
Figure 11C:
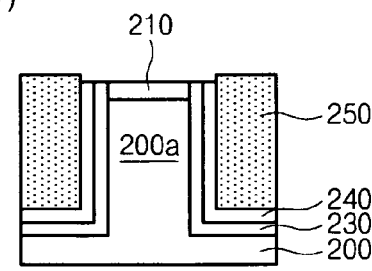

Referring to FIG. 11C, an etching process performed to etch the pad nitride film 220 and the exposed portions of the liner nitride film 240 and the sidewall oxide film 230. The pad nitride film 220 is completely removed by the etching process while the liner nitride film 240 and the sidewall oxide film 230 in the cell region is etched until the depth is substantially the same as the device isolation film 250 etched by the etching process described in FIG. 11B. The pad oxide film 210 is also etched so as to remain on the surface of the semiconductor substrate 200. That is, the device isolation film 250, the pad nitride film 220, the liner nitride film 240 and the sidewall oxide film 230 in the cell region are etched to expose a sidewall of the active region 200a while only the pad nitride film 220 and a predetermined thickness of the pad oxide film 210 in the $V_{PP}$ and the $V_{DD}$ peripheral circuit regions are etched.

Figure 11D:
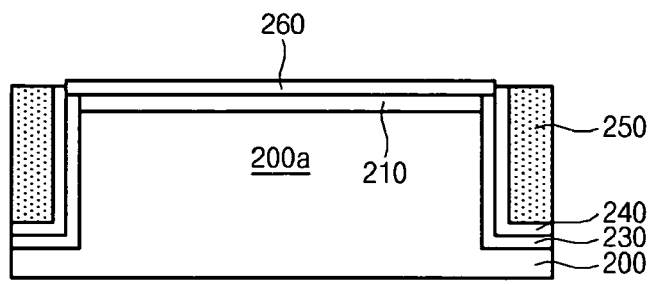
Figure 11D:
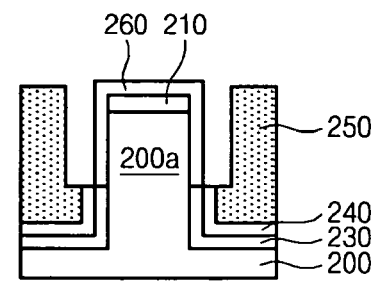
Figure 11D:
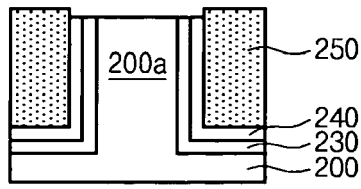
Figure 11D:
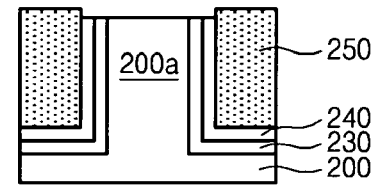

Referring to FIG. 11D, the pad oxide film 210 and the exposed portions of the active region 200a are oxidized to form a first gate oxide film (not shown). A photoresist film pattern (not shown) exposing the $V_{PP}$ peripheral circuit region and the $V_{DD}$ peripheral circuit region is then formed. The pad oxide film 210 and the first gate oxide film in the $V_{PP}$ peripheral circuit region and the $V_{DD}$ peripheral circuit region are removed by wet etching using the photoresist film pattern as an etching mask to form a first gate oxide film pattern 260 in the cell region. The photoresist film pattern is then removed so that only the first gate oxide film pattern 260 remains in the cell region.

Figure 11E:
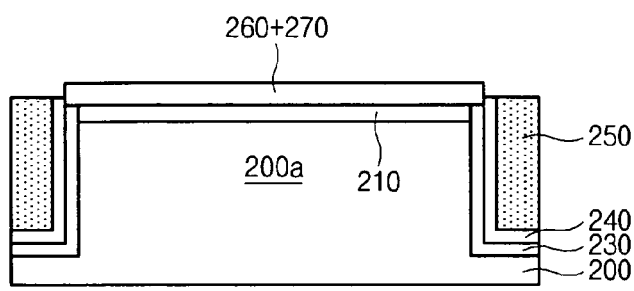
Figure 11E:
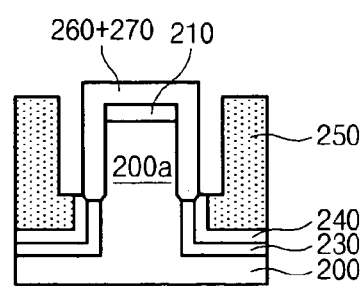
Figure 11E:
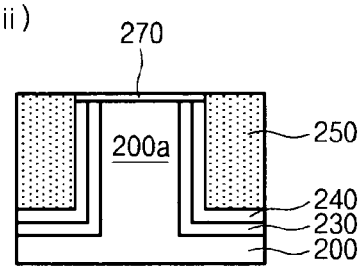
Figure 11E:
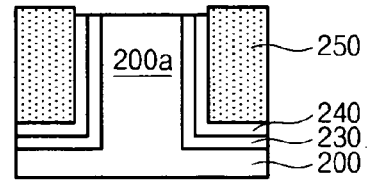

Referring to FIG. 11E, the first gate oxide film pattern 260 is subjected to a cleaning process. Thereafter, a second gate oxide film (not shown) is formed on surfaces of the first gate oxide film pattern 260 and the semiconductor substrate 200 in the $V_{PP}$ peripheral circuit region and $V_{DD}$ peripheral circuit region. A photoresist film pattern (not shown) exposing the second gate oxide film in the $V_{DD}$ peripheral circuit region is then formed. Next, The exposed portion of the $V_{DD}$ peripheral circuit region is subjected to an impurity implant process for controlling threshold voltage of transistor. Thereafter, the exposed portion of the second gate oxide film in the $V_{DD}$ peripheral circuit region is removed by wet etching using the photoresist film pattern as an etching mask to form a second gate oxide film pattern 270 in the cell region and the $V_{PP}$ peripheral circuit region. The photoresist film pattern is then removed. The thickness of the gate oxide film on the top portion of the active region 200a in the cell region is substantially the same as that of a stacked structure 210+260+270 of the pad oxide film 210, the first gate oxide film pattern 260 and the second gate oxide film pattern 270, and the thickness of the gate oxide film on the sidewall of the active region 200a in the cell region is substantially the same as that of a stacked structure 260+270 of the first gate oxide film pattern 260 and the second gate oxide film pattern 270.

Figure 11F:
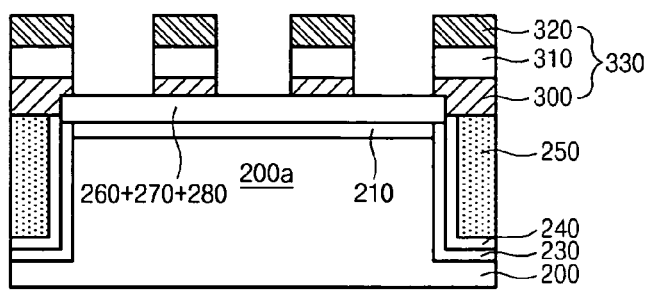
Figure 11F:
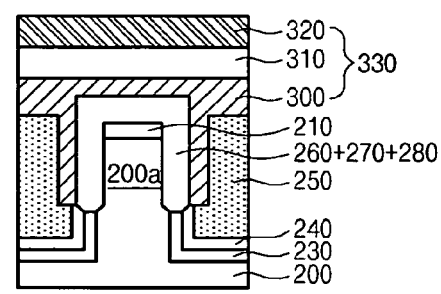
Figure 11F:
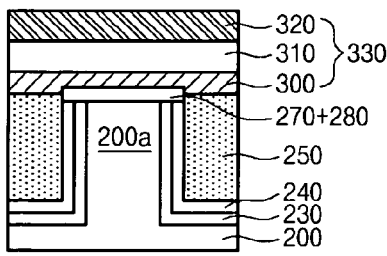
Figure 11F:
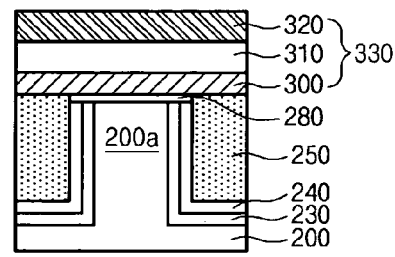

Now referring to FIG. 11F, the first gate oxide film pattern 260 and the second gate oxide film pattern 270 are subjected to a cleaning process. Thereafter, a third gate oxide film pattern 280 is formed on surfaces of the second gate oxide film pattern 270 and the semiconductor substrate 200 in the $V_{DD}$ peripheral circuit region. The thickness of the gate oxide film in the cell region is substantially the same as that of a stacked structure 210+260+270+280 of the pad oxide film 210, the first gate oxide film pattern 260 and the second gate oxide film pattern the first gate oxide film pattern 270 and third gate oxide film pattern 280, and the thickness of the gate oxide film in the $V_{PP}$ peripheral circuit region is substantially the same as that of a stacked structure 270+280 of the second gate oxide film pattern 270 and the third gate oxide film pattern 280.

Thereafter, a conductive layer (not shown) for lower gate electrode is formed on an entire surface of the semiconductor substrate 200 and then planarized. A conductive layer (not shown) for upper gate electrode and a hard mask layer (not shown) are sequentially stacked on the conductive layer for lower gate electrode. The hard mask layer, conductive layer for upper gate electrode and the conductive layer for lower gate electrode are etched via a photolithography and etching process using a gate mask (not shown) to form a gate structure 330 comprising a stacked structure of the lower gate electrode 300, the upper gate electrode 310 and the hard mask pattern 320. Thereafter, a source/drain region (not shown) is formed on the semiconductor substrate 200 at both sides of the gate structure 330.

As discussed earlier, in accordance with the present invention, the gate oxide films in the cell region, $V_{PP}$ peripheral circuit region and $V_{DD}$ peripheral circuit region are formed to have different thicknesses from one another so that the threshold voltage of the cell transistor may be increased to a desired value as well as increasing the operation speed of the transistor and suppress the short channel effect.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing semiconductor device, the method comprising the steps of:
   (a) providing a semiconductor substrate including a cell region when Fin cell transistors are formed, a $V_{PP}$ peripheral circuit region where transistors used for generation and transfer of $V_{PP}$ voltage are formed, and a $V_{DD}$ peripheral circuit region where $V_{DD}$ transistors are formed;
   (b) forming a device isolation film on the semiconductor substrate to define an active region;
   (c) etching the device isolation film in the cell region to at least expose a sidewall of a predetermined portion of the active region where a channel region is to be formed;
   (d) forming a first gate oxide film pattern on a surface of the active region including the exposed sidewall in the cell region;
   (e) forming a second gate oxide film pattern on the first gate oxide film pattern and a surface of the semiconductor substrate in the $V_{PP}$ peripheral circuit region;
   (f) forming a third gate oxide film pattern on the second gate oxide film pattern and a surface of the semiconductor substrate in the $V_{DD}$ peripheral circuit region;
   (g) forming a planarized conductive layer for a lower gate electrode on an entire surface of the semiconductor substrate;
   (h) sequentially forming a conductive layer for an upper gate electrode and a hard mask layer on the conductive layer for the lower gate electrode;
   (i) patterning the hard mask layer, the conductive layer for the upper gate electrode and the conductive layer for the lower gate electrode to form a gate structure including Fin cell gates in the cell region, wherein the gate structure comprises a stacked structure of the lower gate electrode, the upper gate electrode and a hard mask layer pattern; and
   (j) forming a source/drain region on the semiconductor substrate at both sides of the gate structure;
   wherein the thickness of the gate oxide film of the Fin cell transistor in the cell region is larger than that of the transistor used for the $V_{PP}$ peripheral circuit region, and the thickness of the gate oxide film of the transistor used for the $V_{PP}$ peripheral circuit region is larger than that of the transistor used for the $V_{DD}$ peripheral circuit region and
   wherein the gate oxide film of the Fin cell transistor includes the first, the second and the third gate oxide film patterns, the gate oxide film of the $V_{DD}$ peripheral circuit region includes the second and the third gate oxide film patterns, and the gate oxide film of the $V_{PP}$ peripheral circuit region includes the third gate oxide film patterns.

2. The method according to claim 1, wherein the step (b) comprises:
   (b-1) forming a pad oxide film and a pad nitride film on the semiconductor substrate;
   (b-2) etching a predetermined region of the pad nitride film, the pad oxide film and the semiconductor substrate to form a device isolation trench;
   (b-3) forming a sidewall oxide film and a liner nitride film on the entire surface of the semiconductor substrate and
   (b-4) forming an oxide film for the device isolation film on the entire surface of the semiconductor substrate and planarizing the oxide film for the device isolation film until the pad nitride film is exposed to form the device isolation film.

3. The method according to claim 2, wherein the step (c) comprises:
   (c-1) forming a photoresist film pattern exposing the device isolation film in the cell region;
   (c-2) etching the exposed device isolation film using the photoresist film pattern as a mask to expose the sidewall oxide film and the liner nitride film on the sidewall of the predetermined portion of the active region where the channel region is to be formed;
   (c-3) removing the pad nitride film and the liner nitride film;
   (c-4) etching the exposed sidewall oxide film and a predetermined thickness of the pad oxide film to at least expose the sidewall of the predetermined portion of the active region; and
   (c-5) removing the photoresist film pattern.

4. The method according to claim 2, wherein the step (c) comprises:
- (c-1) forming a photoresist film pattern having an island type window, the window exposing the predetermined region of the active region where the channel region is to be formed and a portion of the device isolation film the cell region adjacent to the channel region;
- (c-2) etching the exposed portion of the device isolation film using the photoresist film pattern as a mask to expose the sidewall oxide film and the liner nitride film on the sidewall of the exposed portion of the active region where the channel region is to be formed;
- (c-3) removing the pad nitride film and the liner nitride film;
- (c-4) etching the exposed sidewall oxide film and a predetermined thickness of the pad oxide film to at least expose the sidewall of the predetermined portion of the active region;
- (c-5) removing the photoresist film pattern.

5. The method according to claim 4, wherein the window has a shape of a rectangle, a polygon of an ellipse having a width larger than a width Fx of the gate structure by 2D and a height larger than a line width Fy of the active region by 2E, where $0 \leq D < 0.5Fx$, $0 < e < 0.75Fy$.

6. The method according to claim 4, wherein a line width of a lower part of the lower gate electrode which fills a region formed by etching the device isolation film in step (c-2), is smaller than that of the gate structure.

7. The method according to claim 3, wherein the step (d) comprises:
- forming a first gate oxide film on the semiconductor substrate including a surface of the pad oxide film;
- forming a first photoresist film pattern exposing a portion of the first gate oxide film in the VPP peripheral circuit region and the VDD peripheral circuit region;
- etching the exposed portion of the first gate oxide film using the first photoresist film pattern as a mask to remove the first gate oxide film in the VPP peripheral circuit region and the VDD peripheral circuit region, thereby forming the first gate oxide film pattern; and
- removing the first photoresist film pattern.

8. The method according to claim 1, wherein the step (d) further comprises cleaning the first gate oxide film pattern.

9. The method according to claim 1, the step (e) comprises:
- (e-1) forming a second gate oxide film on the semiconductor substrate including the first gate oxide film pattern;
- (e-2) forming a second photoresist film pattern exposing a portion of the second gate oxide film in the VDD peripheral circuit region;
- (e-3) etching the exposed portion of the second gate oxide film using the second photoresist film pattern as a mask to remove the second gate oxide film in the VDD peripheral circuit region, thereby forming the second gate oxide film pattern; and
- (e-4) removing the second photoresist film pattern.

10. The method according to claim 1, wherein the step (e) further comprises cleaning the second gate oxide film pattern.

11. The method according to claim 1, further comprising performing a well ion implant process and a cell channel implant process after performing the step (b).

12. The method according to claim 3, further comprising performing a well ion-implant process and a cell channel ion-implant process after performing the step (c).

13. The method according to claim 9, further comprising implanting an impurity for adjusting threshold voltage in the VDD peripheral circuit region after performing the step (e-2).

14. The method according to claim 1, wherein the step (b) further comprises rounding a top corner of a device isolation trench.

15. The method according to claim 14, wherein the step (b) further comprises:
- removing the pad nitride film and the pad oxide film in the cell region and the peripheral regions; and
- forming a first oxide film on a portion of the semiconductor substrate exposed by removing the pad oxide film.

16. The method according to claim 15, wherein the step (c) comprises:
- (c-1) etching a portion of the device isolation film adjacent to the predetermined portion of the active region where a channel region is to be formed to expose a portion of the sidewall oxide film and a portion of the liner nitride film on a sidewall of the predetermined portion of the active region; and
- (c-2) removing the exposed portions of the sidewall oxide film and the liner nitride film to expose the predetermined portion of the active region.

17. The method according to claim 16, wherein a line width of a lower part of the lower gate electrode, which fills a region formed by etching the device isolation film in step (c-1), is smaller than that of the gate structure.

18. The method according to claim 16, wherein the step (c-1) comprises:
- forming a photoresist film pattern exposing the predetermined portion of the active region and the portion of the device isolation film in the cell region adjacent thereto;
- etching the exposed portion of the device isolation film; and
- removing the photoresist film pattern.

19. The method according to claim 16, further comprising performing a cell channel angled implant process after performing the step (c-1).

20. The method according to claim 15, wherein the step (c) comprises:
- (c-1) etching the device isolation film by a predetermined thickness to expose a portion of the sidewall oxide film and the liner nitride film in the cell region;
- (c-2) performing a cell channel angled implant process; and
- (c-3) removing the exposed, portion of the sidewall oxide film and the liner nitride film to expose a sidewall of the predetermined portion of the active region.

21. The method according to claim 15, wherein the step (d) comprises:
- forming a first gate oxide film on a surface of the semiconductor substrate;
- forming a first photoresist film pattern exposing a portion of the first gate oxide film in the VPP peripheral circuit region and the VDD peripheral circuit region;
- etching the exposed portion of the first gate oxide film using the first gate oxide film in the VPP peripheral circuit region and the VDD peripheral circuit region, thereby forming the first gate oxide film pattern; and
- removing the first photoresist film pattern.

22. The method according to claim 15, wherein the step (e) comprises:
- (e-1) forming a second gate oxide film on the semiconductor substrate including the first gate oxide film pattern;
- (e-2) forming a second photoresist film pattern exposing a portion of the second gate oxide film in the VDD peripheral circuit region;
- (e-3) etching the exposed portion of the second gate oxide film using the second photoresist film pattern as a mask to remove the second gate oxide film in the VDD peripheral circuit region, thereby forming the second gate oxide film pattern; and removing the second photoresist film pattern.

23. The method according to claim 15, wherein the step (d) further comprises cleaning the first gate oxide film pattern.

24. The method according to claim 14, wherein the step (e) further comprises cleaning the second gate oxide film pattern.

25. The method according to claim 22, further comprising implanting an impurity for adjusting threshold voltage in the VDD peripheral circuit region after performing the step (e-2).

* * * * *